(12) United States Patent
Parry et al.

(10) Patent No.: US 6,680,636 B1
(45) Date of Patent: Jan. 20, 2004

(54) METHOD AND SYSTEM FOR CLOCK CYCLE MEASUREMENT AND DELAY OFFSET

(75) Inventors: David Parry, San Jose, CA (US); Hansel Collins, Mountain View, CA (US); Paul Everhardt, Sunnyvale, CA (US)

(73) Assignee: Silicon Graphics, Inc., Mountain View, CA (US)

( * ) Notice: Subject to any disclaimer, the term of this patent is extended or adjusted under 35 U.S.C. 154(b) by 0 days.

(21) Appl. No.: 09/541,068

(22) Filed: Mar. 31, 2000

(51) Int. Cl.[7] .................................................. H03L 7/00
(52) U.S. Cl. ........................ 327/161; 327/237; 327/269; 370/508
(58) Field of Search ................................. 327/161, 165, 327/231, 237, 269–271, 276, 296; 375/371, 372; 370/503–508, 516–518; 713/400, 401

(56) References Cited

U.S. PATENT DOCUMENTS

| | | | | | |
|---|---|---|---|---|---|
| 4,118,738 A | * | 10/1978 | Arnstein | ...................... | 348/497 |
| 4,415,984 A | * | 11/1983 | Gryger et al. | .............. | 713/401 |
| 4,618,787 A | * | 10/1986 | Jackier et al. | ............... | 327/262 |
| 5,537,069 A | * | 7/1996 | Volk | ........................... | 327/149 |

\* cited by examiner

Primary Examiner—Minh Nguyen
(74) Attorney, Agent, or Firm—Schwegman, Lundberg, Woessner & Kluth, P.A.

(57) ABSTRACT

A clock edge placement circuit for implementing source synchronous communication between integrated circuit devices. The clock edge placement circuit includes a delay line having an input to receive a clock signal from an external clock source. A corresponding output is included to provide the clock signal to external logic elements. The delay line structure adapted to add a propagation delay to the input, wherein the propagation delay is sized such that the phase of the clock signal is adjusted to control synchronous sampling by the external logic elements. The delay line is adapted to dynamically adjust the delay such that the phase of the clock signal at the output remains adjusted to control synchronous sampling by the external logic as variables affecting the phase of the clock signal change over time. A series of taps are included within the delay line. The delay line uses the series of taps to add a variable delay for adjusting the phase of the clock signal. Each tap is configured to add an incremental delay to the input to generate the variable delay.

19 Claims, 19 Drawing Sheets

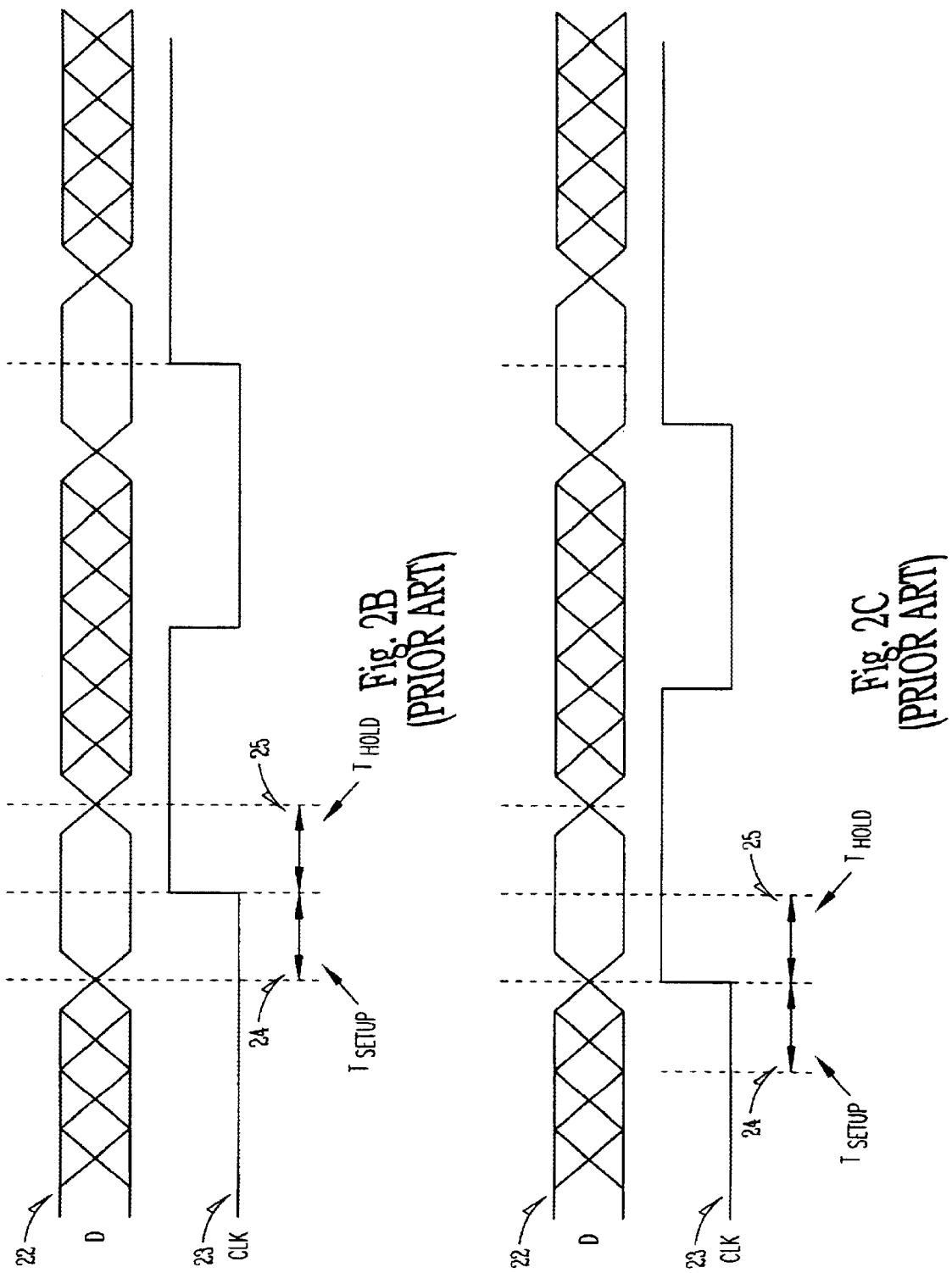

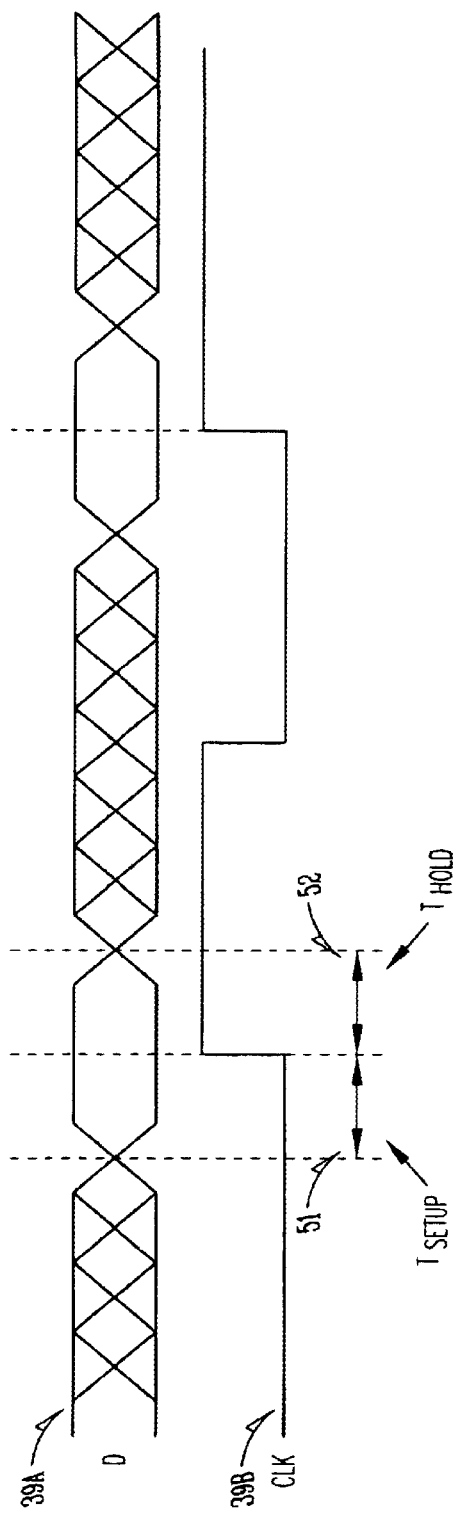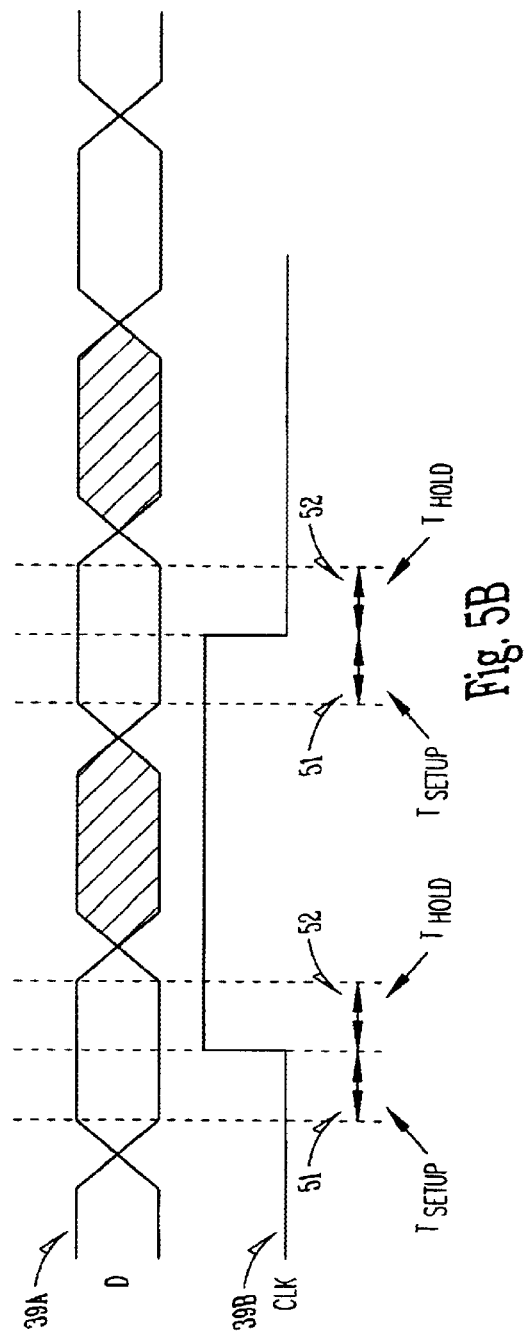

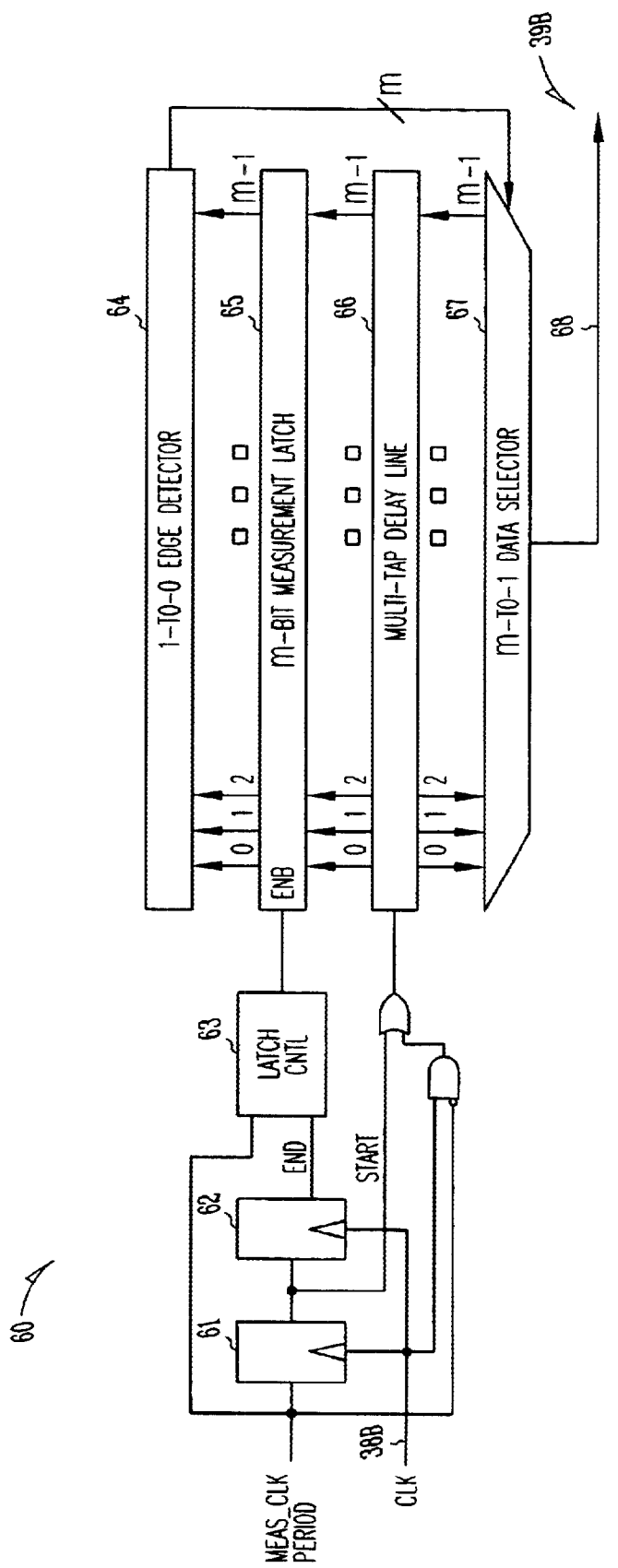

71 →

| IF MEAS LATCH CONTAINS: | DESIRED NUMBER OF DELAY TAPS: |
|---|---|
| 0000_0000_0000_ ··· _0000 | 0 |
| 1000_0000_0000_ ··· _0000 | 0 |
| 1100_0000_0000_ ··· _0000 | 1 |
| 1110_0000_0000_ ··· _0000 | 1 |
| 1111_0000_0000_ ··· _0000 | 1 |
| 1111_1000_0000_ ··· _0000 | 1 |
| 1111_1100_0000_ ··· _0000 | 2 |
| 1111_1110_0000_ ··· _0000 | 2 |
| 1111_1111_0000_ ··· _0000 | 2 |
| 1111_1111_1000_ ··· _0000 | 2 |
| 1111_1111_1100_ ··· _0000 | 3 |
| 1111_1111_1110_ ··· _0000 | 3 |

72 →

THIS IS THE SAME AS ONLY LOOKING AT EVERY 4TH LATCH OUTPUT STARTING AT THE SECOND LATCH WITH THE SAME 1-TO-0 EDGE DETECT CIRCUIT

CHANNEL 0  1111111111111111111111111X000000  REALLY FAST LINE
CHANNEL 1  111111111111111111X00000000000000  FAST LINE
CHANNEL 2  11111111X0000000000000000000000000  SLOW LINE

METHOD AND SYSTEM FOR CLOCK CYCLE MEASUREMENT AND DELAY OFFSET

FIELD OF THE INVENTION

The field of the present invention pertains to data communications between digital systems. More particularly, the present invention relates to a method and system for high performance source synchronous data communication between integrated circuit devices.

BACKGROUND OF THE INVENTION

The field of data communications represents one of the most rapidly evolving technologies in wide spread use today. Data communications and data processing has become important to virtually every segment of the nation's economy. Whole new industries and companies have organized around the need for, and the provision of, data communications. Through the use of specialized semiconductors for signal processing and data compression, various multimedia applications are evolving which orient data communications to the transport of voice, data, and video information, the types of information desired by the everyday consumer.

Recently, the computer and data processing industries are seeing a large expansion in the requirements for high performance, high speed data communications between multiple integrated circuits on, for example, printed circuit boards. For example, it is becoming increasingly common to implement high-performance digital systems using multiple integrated circuit modules, or chips, interconnected on a high-speed printed circuit board. The multiple chips are typically highly integrated, having several million transistors per chip, and operating at very high speeds (e.g., 500 MHz or above). With such technology, the speed and integrity of the data communications between the chips becomes very critical.

Data is commonly transferred between computer systems and terminals by changes in the current or voltage on a metal wire, or channel, between the systems. These interconnections are typically etched into the material of the printed circuit board itself. A data transmission in which a group of bits moves over several channels simultaneously is referred to as a parallel transmission. A data transmission where the bits move over a single channel, one after the other, is referred to as a serial transmission. Computers and other data processing systems which are located on a single printed circuit board normally use parallel transmission because it is much faster.

As the level of integration and the operating speeds of the multiple chips on printed circuit boards increases, the transmission of data between and among the multiple chips via the channels of the printed circuit board suffer a number of limitations. One such limitation is due to the fact that most digital systems are designed to operate synchronously with respect to the individual integrated circuits which comprise the system. For example, the multiple chips coupled to a printed circuit board are typically designed to operate synchronously with respect to one another, using well-defined clock frequency and phase relationships. However, as the operating speeds of the multiple chips increases, the tolerance of the system for "timing skew" among the multiple data channels decreases. The timing relationship between, for example, the clock signal shared among the multiple chips and the corresponding data signals conveyed across the channels becomes increasingly critical. Prior Art FIG. 1 below illustrates this problem.

Prior Art FIG. 1 shows a typical high-speed multichip device 10. Device 10 includes a first chip 11 (e.g., chip 1) a second chip 12 (e.g., chip 2). Chips 11 and 12 are communicatively coupled via data channels of a printed circuit board. One such data channel 14 is shown. Chips 11 and 12 share a common clock signal 16 and operate synchronously with respect to clock signal 16.

As described above, as the operating speeds of multichip device (e.g. system 10) increases, the tolerance of the system for timing skew among the data channels and with respect to the clock signal decreases. FIG. 1 depicts this problem. The high level of integration of chips 11 and 12 causes a clock insertion delay, depicted as clock insertion delay 15, as the clock signal 16 propagates among the millions of transistors comprising chips 11 and 12. As the clock signal reaches logic elements 17 and 18 deeply within chips 11 and 12, the phase relationship of the output of logic element 17 and the input of logic element 18 can vary significantly. For the device 10 to remain synchronous, the output of logic element 17 needs to be received at the input of logic element 18 prior to the next cycle of clock 16. The propagation delay, Tpd 13, from the output pin of chip 11 to the input pin of chip 12 constitutes a significant portion of this delay.

As system 10 is designed, engineers account for the various delay factors in designing system 10 to operate at its maximum speed. For example, the delay of clock 16 propagates to each chip is accounted for by, for example, precisely defining the length of the channels transmitting clock 16 to each chip. Similarly, the length of the data channels, such as data channel 14, between the chips is precisely defined. However, the clock insertion delay incurred in each chip as clock 16 propagates among the millions of transistors comprising the chips cannot be as precisely controlled. Numerous variables (e.g., fabrication process variation, temperature, voltage fluctuation, etc.) affect the propagation delay, and unfortunately, many of these variables cannot be precisely ascertained or controlled. The variables affect the "setup-and-hold" timing tolerances of the overall device.

Prior Art FIGS. 2A–2C illustrate the setup-and-hold timing tolerance problem. FIG. 2A shows a typical logic element 21 as contained in chips 11 and 12. Element 21 depicts an edge triggered flip-flop having a data input, a data output, and a clock input as shown. FIG. 2B shows a diagram of the proper timing relationship between data 22 and the clock signal 23. As depicted in FIG. 2B, ideally, the rising edge of the clock signal 23 is placed such that perfectly corresponds to the setup time 24 of the data input 22 and the hold time 25. This provides the maximum likelihood that the correct value of the data input is clocked into logic element 21. FIG. 2C shows a diagram of an improper timing relationship between data 22 and the clock signal 23. In this case, the phase relationship between the clock signal 23 in the data 22 has deteriorated such that the setup and hold times 24 and 25 are not properly placed with respect to the phase of the data signal 22. In this case, the rising edge of clock signal 23 does not correspond to the correct value of the data input 22, leading to "indeterminate" operation of the logic element 21. This deterioration is typically due to the uncontrollable variables described above (e.g., fabrication process variation, temperature, voltage fluctuation, etc.).

Hence, a significant amount of uncertainty exists regarding the maximum possible speed of the multichip device, which leads to extensive testing to determine "safe" operating margins, device malfunctions, and/or less than optimal device configurations. Device 10 must be engineered such that it retains enough margin to ensure proper operation taking into account performance variables such as process variation, temperature, and the like.

One attempted solution creates individual serial data bit streams out of each channel. This scheme encodes the clock signal directly into the bit stream, recovering the clock signal at the receiver and reconstructing the data word through signal processing techniques. This system requires complex (e.g., expensive) signal processing at the transmitting chip and the receiving chip and is thus generally impractical for printed circuit board type devices.

Another attempted solution performs a complex set of analyses on test signal patterns on each of the channels between the multiple chips. The results of the analysis are used to reconfigure compensation or filter circuits between the chips to account for the respective skew distortion in each channel. One such technique used for multichip devices involves custom configuring the length of the clock signal channel with respect to the data channels. The problem with this solution, in addition to its excessive expense, is that the propagation delays causing the skew are dynamic. As described above, a number of the variables that affect the propagation delay are not constant from device to device (e.g., process variation, temperature, voltage, etc.) and the variables themselves are constantly changing.

Thus, what is required is a method and system which overcomes the limitations of prior art source synchronous multichip device implementations. The required solution should accurately and reliably compensate for skew distortion caused by propagation delay (e.g., the clock signal skewing from the proper phase relationship with the data signals). The required solution should realize higher clock speeds for a given multichip implementation than possible with prior art systems. The required system should minimize the effects of process variation on skew distortion. The required system should not require extensive and complex testing to characterize the propagation delay of the clock signal or excessively interrupt data transmission for channel testing. The present invention provides a novel solution to the above requirements.

SUMMARY OF THE INVENTION

The present invention provides a method and system that overcomes the clock skew distortion limitations of prior art source synchronous multichip device implementations. The present invention accurately and reliably compensates for clock signal skew distortion caused by propagation delay. The present invention realizes higher clock speeds for a given multichip implementation than possible with prior art systems. Additionally, the present invention is able to minimize the effects of process variation on skew distortion, does not require extensive and complex testing to characterize the propagation delay of the clock signal, and does not excessively interrupt data transmission for channel testing.

In one embodiment, the present invention comprises a clock edge placement circuit for implementing source synchronous communication between integrated circuit devices. The clock edge placement circuit includes a delay line having an input to receive a clock signal from an external clock source. A corresponding output is included to provide the clock signal to external logic elements. The delay line is adapted to add a propagation delay to the input, wherein the propagation delay is sized such that the phase of the clock signal is adjusted to control synchronous sampling by the external logic elements. The delay line is configured to allow the dynamic adjustment of the propagation delay such that the phase of the clock signal at the output remains adjusted to control synchronous sampling by the external logic as variables affecting the phase of the clock signal change over time. A plurality of taps are included within the delay line, wherein each tap his configured to add an incremental delay to the input to generate the variable delay.

By dynamically adjusting the propagation delay between the input and the output using the taps, the clock edge placement circuit of the present invention overcomes the clock skew distortion limitations of prior art source synchronous multichip device implementations. The present invention accurately and reliably compensates for skew distortion caused by propagation delay within the chip. For example, instead of distributing a common clock signal in parallel among the multiple chips of the multichip device, the clock signal can be transmitted directly, along with the data, from chip to chip with the assurance that the clock edge placement circuit will adjust the phase of the clock signal in accordance with the setup-and-hold times required to maintain reliable synchronous sampling.

In so doing, the clock edge placement circuit allows the integrated circuit devices to realize higher clock speeds for a given multichip implementation than possible with prior art systems. The dynamic edge placement process of the clock edge placement circuit its able to minimize the effects of process variation on clock skew distortion, does not require extensive and complex testing to characterize the propagation delay of the clock signal, and does not excessively interrupt data transmission for channel testing.

BRIEF DESCRIPTION OF THE DRAWINGS

The present invention is illustrated by way of example and not by way of limitation, in the Figures of the accompanying drawings and in which like reference numerals refer to similar elements and in which:

Prior Art

Prior Art

Prior Art FIG. 2B shows a diagram of a proper timing relationship between a data signal and a clock signal.

Prior Art FIG. 2C shows a diagram of an improper timing relationship between a data signal and a clock signal.

FIG. 5A shows a timing diagram showing the phase relationship of the data signals and the clock signals for the logic element shown in FIG. 4.

FIG. 5B shows a timing diagram showing the phase relationship of the data signals and the clock signals for the logic element shown in FIG. 4, wherein data is transferred on both the rising edge and the falling edge of the clock signals.

FIG. 6 shows a diagram of a clock edge placement circuit in accordance with one embodiment of the present invention.

FIG. 7 shows a first and second legend illustrating the decode process used to measure the clock period of an incoming clock signal in accordance with one embodiment of the present invention.

DETAILED DESCRIPTION OF THE INVENTION

Figure 1:
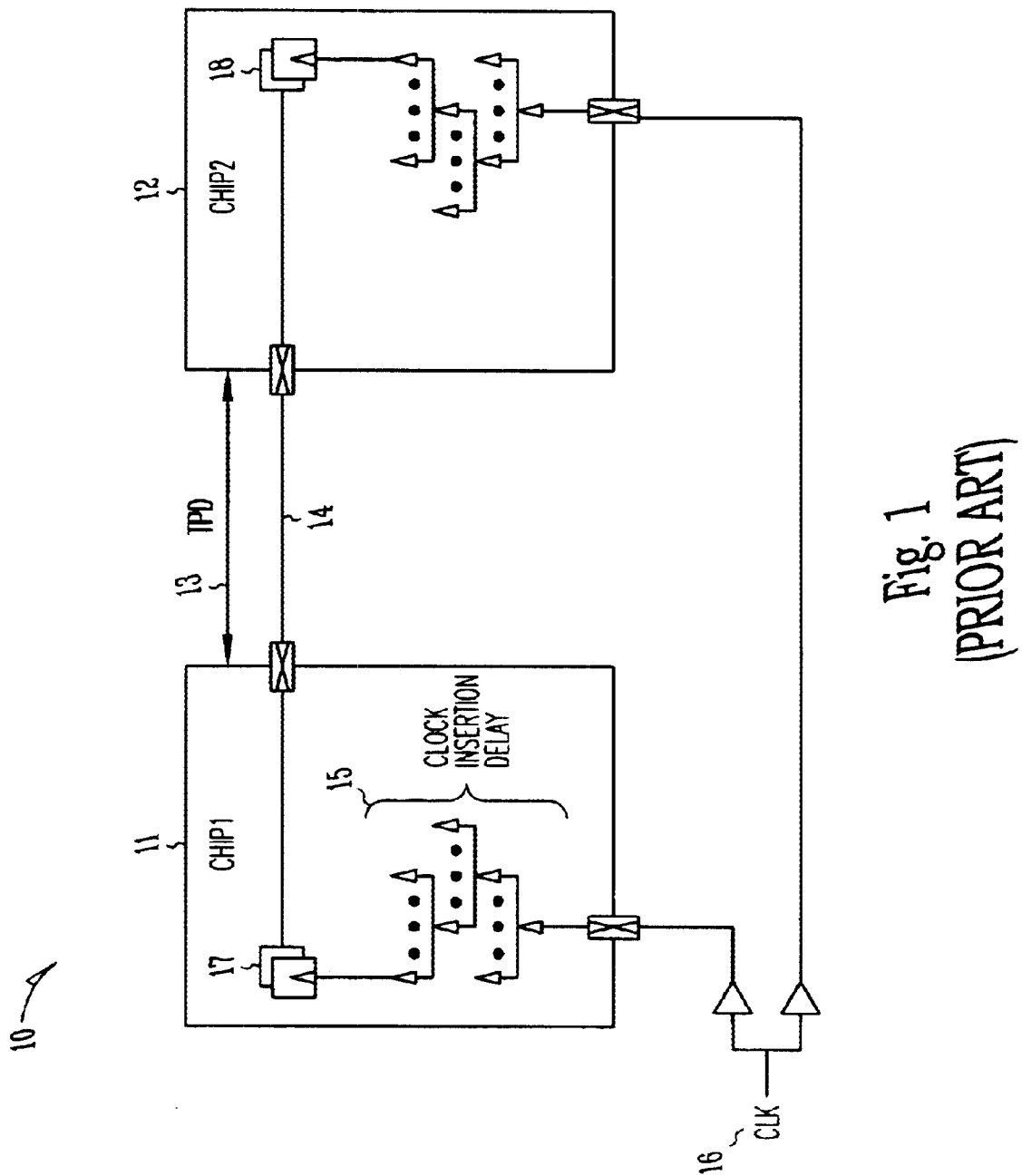
FIG. 1 shows a typical high-speed multichip device.
Figure 2A:
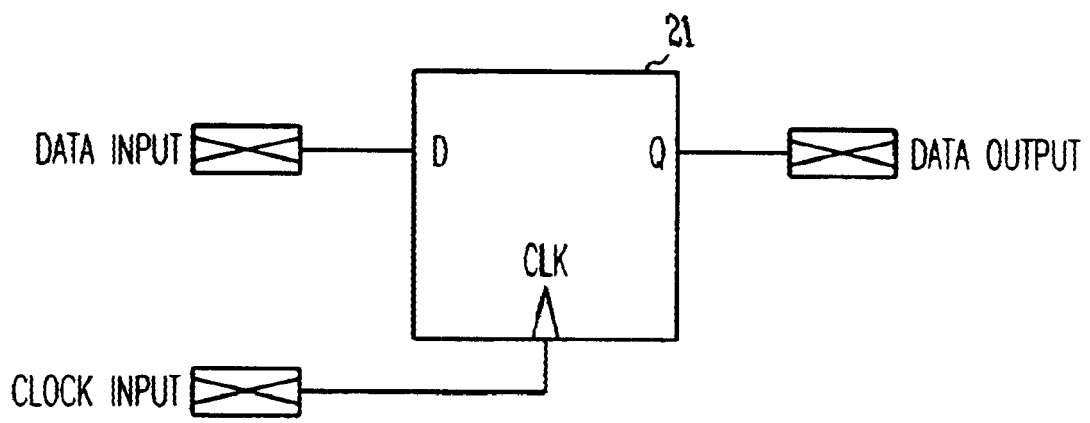
FIG. 2A shows a typical logic element as contained in a multichip device.

In the following detailed description of the present invention, a method and system for clock cycle measurement and delay offset, numerous specific details are set forth in order to provide a thorough understanding of the present invention. However, it will be obvious to one skilled in the art that the present invention may be practiced without these specific details. In other instances well known methods, procedures, components, and circuits have not been described in detail as not to unnecessarily obscure aspects of the present invention.

Some portions of the detailed descriptions which follow are presented in terms of procedures, logic blocks, processing, and other symbolic representations of operations on data bits within a computer system. These descriptions and representations are the means used by those skilled in the data processing arts to most effectively convey the substance of their work to others skilled in the art. A procedure, logic block, process, step, etc., is here, and generally, conceived to be a self-consistent sequence of steps or instructions leading to a desired result. The steps are those requiring physical manipulations of physical quantities. Usually, though not necessarily, these quantities take the form of electrical, optical, or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "conveying" or "skewing" or "de-skewing" or "sampling" or "storing" or "latching" or "selecting" or the like, refer to the action and processes of a computer system, or similar data processing device, that manipulates and transforms data represented as physical (electronic) quantities within the computer system's registers and memories into other data similarly represented as physical quantities within the computer system memories or registers or other such information storage, transmission or display devices.

The present invention provides a method and system that overcomes the clock skew distortion limitations of prior art source synchronous multichip device implementations. The present invention accurately and reliably compensates for clock signal skew distortion caused by propagation delay. The present invention realizes higher clock speeds for a given multichip implementation than possible with prior art systems. Additionally, the present invention is able to minimize the effects of process variation on skew distortion, does not require extensive and complex testing to characterize the propagation delay of the clock signal, and does not excessively interrupt data transmission for channel testing. The present invention and its benefits are further described below.

Figure 3:
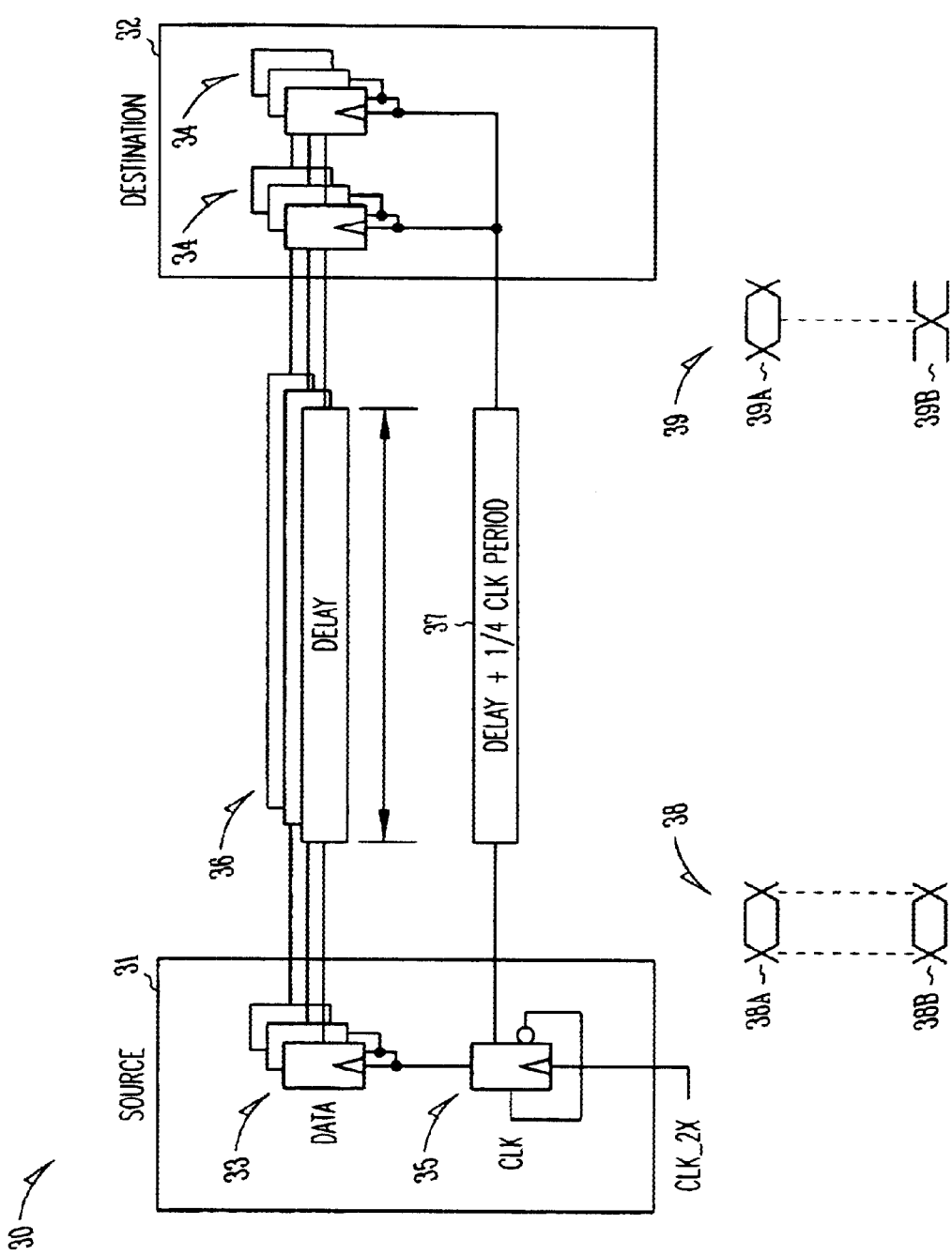
FIG. 3 shows a diagram of a multichip system in accordance with one embodiment of the present invention.

Referring now to FIG. 3, a diagram of a multichip system 30 in accordance with one embodiment of the present invention is shown. As depicted in FIG. 3, the multichip system 30 includes a source chip 31 and a destination chip 32 coupled via a series of data channels 36 and a clock channel 37. FIG. 3 shows the data channels 36 having a certain delay and the clock channel 37 having the same delay as the data channels plus an additional ¼ clock cycle delay. The logic elements 33 of the source chip 31 are coupled to the logic elements 34 of the destination chip via the data channels 36. The clock signal generated by the clock circuit 35 within source chip 31 is coupled to logic elements 34 of the destination chip 32 via the clock channel 37. The clock circuit 35 is driven by a 2× clock signal "Clk_2×" received from an external circuit (not shown). Legend 38 shows the phase relationship between the data signals 38a from data channel 36 and the clock signal 38b from clock channel 37. Legend 39 shows the phase relationship between the data signals 39a as received by logic elements 34 and the clock signal 39b as received by logic elements 34.

System 30 of the present embodiment functions by adjusting the phase of the clock signal emerging from the clock circuit 35 (e.g., clock signal 38b) into the optimal phase position with respect to the data signal. Legends 38 and 39 graphically depict this process. As the data signals emerge from logic elements 33 and the clock signal emerges from clock circuit 35, the signals are phase synchronous with respect to one another. This is shown in legend 38 with data signals 38a and clock signal 38b. The present invention functions by adjusting the phase of the clock signal such that when the clock signal and data signals arrive at logic elements 34 of destination chip 32, the phase of the clock signal is adjusted such that the rising and falling edges of the clock signal are optimally placed (e.g., ¼ clock cycle delay for optimal setup-and-hold times) with respect to the data signals. This is shown by legend 39 with data signals 39a and clock signal 39b.

Figure 4:
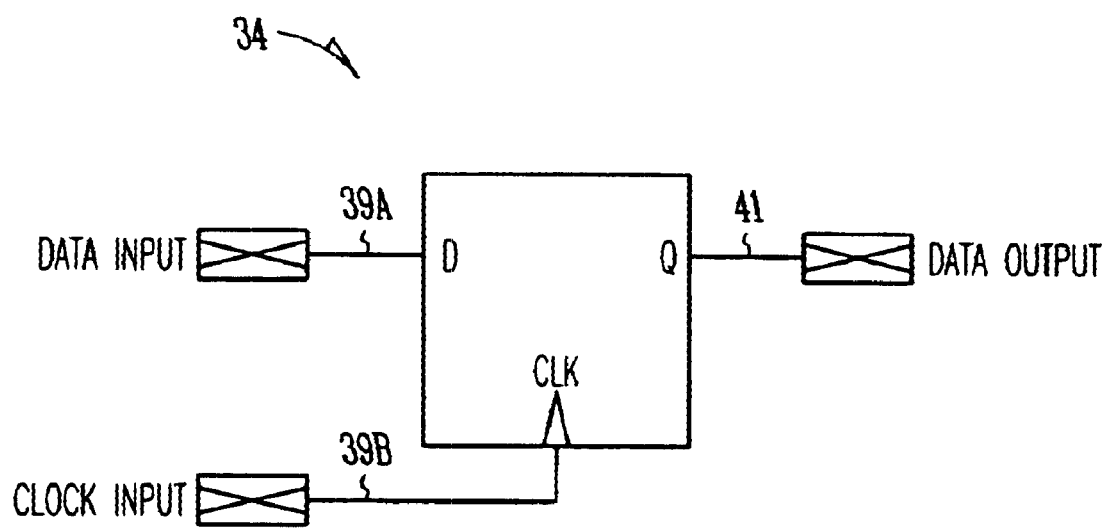
FIG. 4 shows a diagram of an example logic element from an integrated circuit with which the present invention functions.

FIG. 4 and FIGS. 5A–5B show diagrams illustrating the phase relationship between the data signals 39a and clock signal 39b in accordance with one embodiment of the present invention. Referring to FIG. 4, an example logic element 34 from destination chip 32 of FIG. 3 is shown. In this embodiment, logic element 34 is an edge triggered flip-flop having a data input coupled to a data signal 39a, a clock input coupled to clock signal 39b, and a data output 41. As is well known, an edge triggered flip-flop latches the data (e.g., data signal 39a) on its data input on the rising edge of the clock signal (e.g., clock signal 39b) coupled to its clock input.

FIG. 5A shows the phase relationship between data signal 39a and clock signal 39b as implemented by the present embodiment. The rising edge is placed such that the setup time $T_{setup}$ 51 and the hold time $T_{hold}$ 52 are roughly equal, and thus, optimal.

The system of the present invention functions by adjusting the propagation delay of the clock channel (e.g., clock channel 37 of FIG. 3) between the source chip 31 and the destination chip 32 to eliminate the clock skew distortion limitations of prior art source synchronous multichip device implementations. The present invention accurately and reliably places the rising edge of the clock signal at the optimal setup and hold times for the data signal, as shown in FIG. 5. Thus, instead of, for example, distributing a common clock signal in parallel to the source and destination chips 31 and 32, the clock signal is transmitted directly, along with the data, from the source chip 31 to the destination chip 32 with the assurance that the clock edge placement circuit (e.g., circuit 60 shown in FIG. 6 below) will adjust the phase of the clock signal in accordance with setup-and-hold times to maintain reliable synchronous sampling. This aspect allows integrated circuit devices in accordance with the present invention to realize higher clock speeds for a given multichip implementation than possible with prior art systems.

FIG. 5B shows an embodiment where data is transferred on both the rising and the falling edges of the clock signal. The embodiment depicted in FIG. 5B functions in substantially the same manner as the embodiment of FIG. 5A, except that the set-up and hold timing tolerances are smaller. As in FIG. 5A, the clock signal is transmitted directly, along with the data. The clock edge placement circuit (e.g., circuit 60 of FIG. 6) ensures the phase of the clock signal 39b is adjusted such that $T_{setup}$ and $T_{hold}$ are optimal for both the rising and falling edges. Hence, data is transferred twice per clock period (at times referred to as "double pumping"). As shown in FIG. 5B, the phase of the clock signal 39b is adjusted by ¼ clock period to optimize $T_{setup}$ and $T_{hold}$ sampling. The discussions of FIGS. 6–8 below are with respect to double pumped embodiments, with data being transferred on both rising a falling edges of the clock signal.

Referring now to FIG. 6, a diagram of a clock edge placement circuit 60 in accordance with one embodiment of the present invention is shown. As depicted in FIG. 6, the clock edge placement circuit 60 includes a set of edge triggered flip-flops 61–62 coupled to receive the unadjusted clock signal 38b from the source chip 31 (shown in FIG. 3). Edge triggered flip-flops 61–62 are coupled to a latch controller 63. A "1-to-0" edge detector 64, a "m-bit" measurement latch 65, a multi-tap delay line 66, and a m-to-1 data selector multiplexer 67 are coupled as shown. The output 68 of the m-to-1 data selector 67 produces the adjusted clock signal 39b. The components 61–68 comprise the clock edge placement circuit 60.

In a preferred embodiment, the clock edge placement circuit 60 is integrated within the destination chip, where it is configured to receive the incoming clock signal 38b via the data channel 37. In a typical multichip implementation, each destination chip would include a similar clock edge placement circuit of the present invention. Alternatively, the clock edge placement circuit 60 can be implemented as a separate discrete circuit for producing the adjusted clock signal 39b.

As described above, the clock edge placement circuit 60 adjusts the phase of the incoming clock signal 38b to enable source synchronous communication between the source chip 31 and the destination chip 32. In normal operation, the incoming clock signal 38b is used to clock the set of flip-flops 61–62 to produce a start signal. The delay line 66 (e.g., the multi-tap delay line 66) receives the start signal from the flip-flops 61–62 as shown. The start signal is initiated by the assertion of meas_clk_period, which is also used to gate clock signal 38b as shown. The delay line adjusts the phase of the start signal by adding an adjustable amount of propagation delay to the start signal as it propagates along the length of the delay line 66.

In the present embodiment, the delay line 66 comprises a series of "am" delay elements, or taps, arranged end-to-end such that the start signal propagates along the delay line, from one tap to the next (e.g., 0 to m−1), with each tap adding an incremental amount of delay. The size of the propagation delay added to the start signal is determined by the data selector 67 (e.g., the m-to-1 data selector multiplexer 67). The data selector is coupled to receive the start signal from each of the taps 0 to m−1. To add a small amount of delay, the start signal is selected from tap 0, while a large amount of delay is added by selecting the start signal from tap m−1. Varying degrees of delay are added by appropriately selecting one tap along the range from tap 0 to tap m−1. As described above, the amount, or size, of the delay is such that the rising edge of the start signal is optimally located to control synchronous sampling by external logic elements (e.g., logic elements 34 in FIG. 3).

As described above, delay line 66 includes a series of taps coupled end-to-end. The taps are precisely fabricated to be as close a copy as possible to one another, and thus, provide the same amount of delay. Accordingly, each tap (e.g., tap 0) provides the same amount of delay as another tap (e.g., tap 1) within delay line 66. As the start signal is conducted through the taps, toward the right, each tap adds its precise amount of delay, with the proper amount of delay obtained by selecting the proper tap using data selector 67.

For example, where three tap delays are required to properly phase adjust the incoming clock signal 38b (e.g., add ¼ clock period delay), the data selector 67 selects tap 2. Data selector 67 implements a signal path from the clock input to the output of tap 2, to output line 68. In this manner, delay line 66 and data selector 67 can add variable amounts of delay as required.

Referring still to FIG. 6, determining the correct one of taps 0 through m−1 to select is determined by measuring the period of the incoming clock signal 38b. This is accomplished using a "measurement mode" of the clock edge placement circuit 60. The measurement latch 65 (e.g., the m-bit measurement latch 65) is used to measure the clock period. The measurement latch 65 includes a series of individual latches (e.g., latch 0 to latch m−1) coupled to the corresponding taps of delay line 66. During measurement mode, a measurement signal (meas_clk_period) is asserted to the latch controller 63. This causes latch controller 63 to "open" the latches of measurement latch 65 to capture the outputs of the corresponding taps of delay line 66. The propagation of the start signal along delay line 66 is thus captured by the latches of measurement latch 65. The output of flip-flop 62 produces an end signal, precisely one clock cycle after the start signal, which causes latch controller 63 to close the latches of measurement latch 65. This effectively takes a "snap-shot" of the propagation of the start signal along delay line 66. By examining the contents of the individual latches of measurement latch 65, the clock period of the incoming clock signal 38b can be determined in terms of an integral number of delay elements (e.g., as described in the discussion of FIG. 14 below).

In this manner, the individual latches of measurement latch 65 store the progress of the start signal as it rippled down delay line 66. Those taps through which the start signal passed have a logical one stored in their respective latches, while those taps not reached by the start signal prior to the end signal have a logical zero stored in their corresponding latches.

The outputs of the individual latches of measurement latch 65 are coupled to edge detector 64. Edge detector 64 analyzes each of the outputs to determine the progress of the start signal. The number of taps through which the start signal rippled indicates the particular tap output to select in data selector 67, which, in turn, controls the amount of delay to be added. FIG. 7 graphically depicts this process.

Referring now to FIG. 7, a legend 71 and a legend 72 are shown. As described above, the individual latches of measurement latch 65 store the progress of the start signal as it rippled down delay line 66, wherein the taps through which the start signal passed have a logical one stored in their respective latches, while those taps not reached by the start signal prior to the end signal have a logical zero stored in their respective latches. Hence, the number of "1's" in measurement latch 65 is used to determine the desired number of taps to use for the propagation delay, an example of which is shown in legend 71. Additionally, as shown in legend 72, selecting the desired tap is the same as looking at every 4th latch output starting at the second latch with the same 1-to-0 edge detect circuit.

Once the desired tap is determined by the edge detector 64, the edge detector 64 controls data selector 67 to select that desired tap. Subsequently, during normal operation, the data selector 67 implements a signal path from the clock input 38b through the delay line 66 to the desired tap, and out through the output 68.

Figure 8:
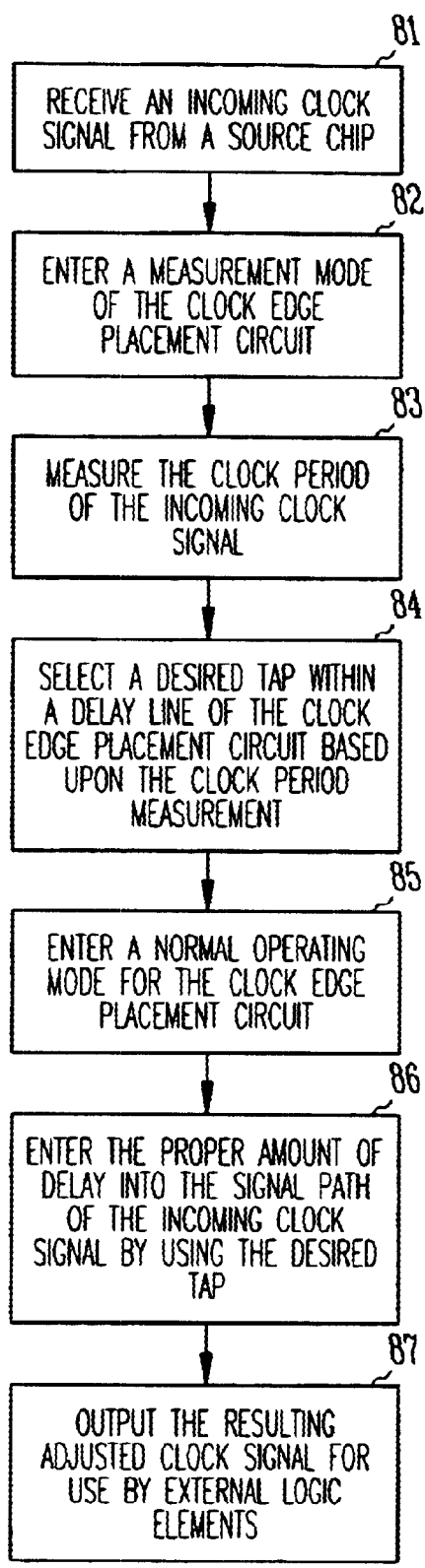
FIG. 8 shows a flow chart of the steps of a clock edge placement process in accordance with one embodiment of the present invention.

Referring now to FIG. 8, a flow chart of the steps of a clock edge placement process 80 in accordance with one embodiment of the present invention is shown. As depicted in FIG. 8, process 80 shows the operating steps of one embodiment of a clock edge placement circuit (e.g., clock edge placement circuit 60 of FIG. 6) as it adjusts the phase of a clock signal from a source chip (e.g., source chip 31 of FIG. 3) prior to its use by logic elements of a destination chip (e.g., destination chip 32 of FIG. 3).

Process 80 begins in step 81 where a destination chip receives an incoming clock signal from a source chip. The clock signal is coupled to the clock edge placement circuit within the destination chip.

In step 82, the clock edge placement circuit enters a measurement mode to measure the period of the incoming clock signal. As described above, the propagation of the start signal (e.g., the start signal shown in FIG. 6) along a delay line included in the clock edge placement circuit is used to precisely measure the period of the clock signal.

In step 83, the period of the incoming clock signal is measured by using a measurement latch (e.g., measurement latch 65) to capture the extent of the propagation of the start signal down the length of the delay line. The contents of the measurement latch are then decoded using a coupled edge detector (e.g., edge detector 64).

In step 84, the results of the measurement from step 82 are used to determine which tap within the delay line of the clock edge placement circuit will be used. As described above, the delay line (e.g., delay line 66 of FIG. 6) is used to insert a variable amount of delay to the incoming clock signal. The amount of delay added depends upon which tap of the delay line is used to generate the output.

In step 85, the clock edge placement circuit enters a normal operating mode, wherein incoming clock signals are automatically adjusted to optimize setup and hold times with respect to the incoming data signals. The tap selected in step 84 is used to add precisely ¼ clock period delay to the incoming clock signal, thereby optimally placing the rising edge of the clock signal with respect to the phase of the data signals.

In step 86, the clock edge placement circuit uses the delay line to insert the proper amount of delay into the signal path of the incoming clock signal. As described above, the tap selected in step 84 is used to implement a signal path for the incoming clock signal, the signal path having the precise amount of delay required (e.g., ¼ clock period).

In step 87, the adjusted clock signal is output from the clock edge placement circuit for use by external logic elements. The adjusted clock signal is coupled to the logic elements of the destination chip, where the adjusted clock signal is used to sample data signals arriving from the source chip.

Thus, the present invention provides a method and system that overcomes the clock skew distortion limitations of prior art source synchronous multichip device implementations. The present invention accurately and reliably compensates for clock signal skew distortion caused by propagation delay. The present invention realizes higher clock speeds for a given multichip implementation than possible with prior art systems. Additionally, the present invention is able to minimize the effects of process variation on skew distortion, does not require extensive and complex testing to characterize the propagation delay of the clock signal, and does not excessively interrupt data transmission for channel testing.

It should be appreciated that the clock edge placement circuit of the present invention can be used in other types signal edge placement applications. One such application is the de-skewing of parallel data channels in a parallel data transmission and reception system. The present invention is described in the context of a parallel data transmission and reception system in the Figures and discussions below.

Figure 9:
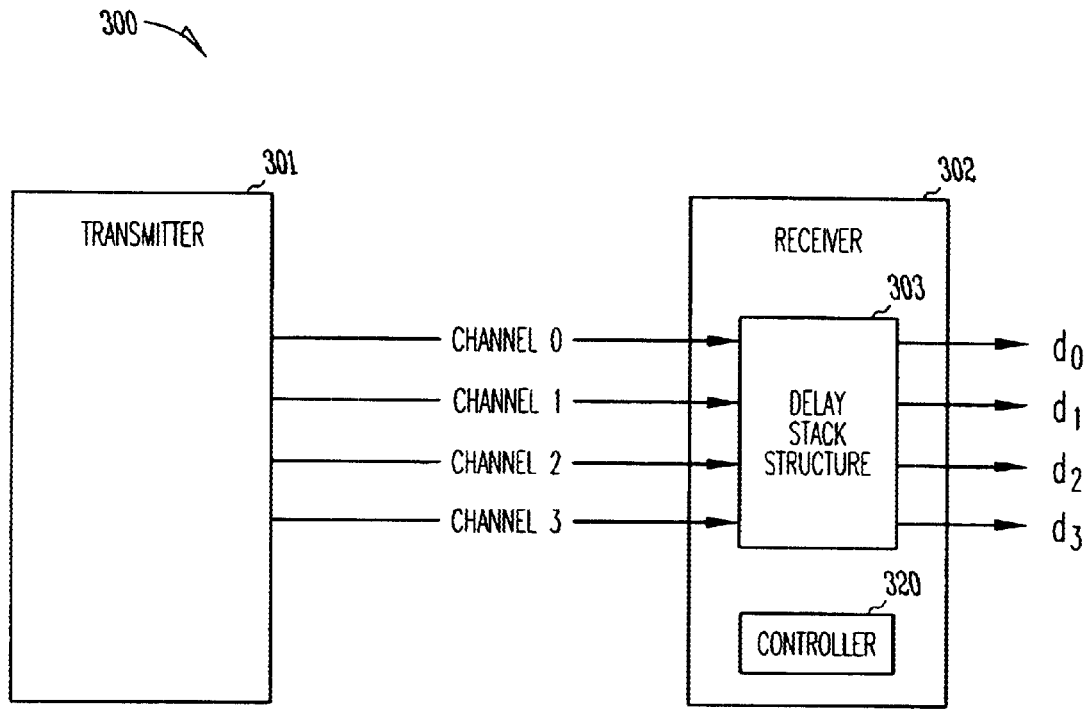
FIG. 9 shows a parallel data transmission and reception system in accordance with one embodiment of the present invention.

Referring now to FIG. 9, a parallel data transmission and reception system 300 in accordance with one embodiment of the present invention is shown. System 300 includes a transmitter 301 coupled to a receiver 302 via communications channels 0 through 3. Channels 0–3 comprise a four channel parallel data transmission cable. Receiver 302 includes a delay stack structure 303 coupled to receive signals from channels 0–3. Delay stack structure 303 generates data outputs d0 through d3. The outputs d0–d3 comprise de-skewed data output channels. A controller 320 controls the operation of delay stack structure 303 and is included within receiver 302.

System 300 functions by de-skewing the four bit data words conveyed by channels 0–3 as they arrive. The individual bits comprising the words are de-skewed and output on d0–d3. Once de-skewed, the data words are used by a coupled data processing system (not shown) in the conventional manner.

In the present embodiment, the four channels 0–3 of system 300 form a portion of a high performance parallel interface (HIPPI) data transmission system. HIPPI is a proposed ANSI (American National Standards Institute) specification for information technology. HIPPI defines a physical level, point to point, full duplex, link interface for reliable, flow-controlled, transmission of data at 6400 Mbit/sec per direction. HIPPI can be implemented over metal wires (e.g., copper) or fiber optics. A more detailed description of HIPPI is contained in "American National Standard for Information Technology—High Performance Parallel Interface—6400 Mbit/s Physical Layer (HIPPI-6400-PH)", hereinafter referred to as the HIPPI specification, and is incorporated herein as background material.

It should be appreciated that while system 300 is shown with four communications channels (e.g., channels 0–3), system 300 implements a HIPPI compliant data transfer system, thus, as is well known in the art, actually includes 22 communications channels in each direction, for a total of 44 communications channels. However, only four communications channels (e.g., channels 0–3) of system 300 are shown, as not to unnecessarily obscure aspects of the present invention.

In addition, while the present embodiment is implemented in accordance with the HIPPI specification, it should be appreciated that the method and system of the present invention is suited to use with other parallel data transmission protocols. For example, the system of the present invention can implement a small computer system interface (SCSI) data transmission and reception system, providing similar advantages over typical prior art SCSI systems. Hence, differing parallel data transfer systems in accordance with differing protocols can be implemented while remaining within the scope of the present invention.

Referring still to FIG. 9, as is well known in the art, the transmission of parallel data over long distances is affected by various factors which cause differing propagation delays of signals transmitted across the channels. These propagation delays cause the arrival times of the signals to differ from their expected, or nominal, arrival times. The individual bits comprising a word are transmitted from transmitter 301 to receiver 302. Due to the differing propagation delays, some bits of the word arrive earlier than nominal and some bits arrive later than nominal. The difference between the bit arrival times is referred to as skew.

If the skew between the individual bits of a word becomes significant, it can be difficult to accurately sample them. As described above, individual bits will appear to drift into the next word. With prior art receivers, this resulted in an error condition. To operate reliably, the prior art receiver could not be very far from the prior art transmitter (e.g., under 3 meters) or, the data rates had to be reduced in order to provide more time between arriving data words, increasing the sampling margin. However, system 300, in accordance with the present invention, actively "de-skews" the channels conveying the data words, greatly increasing the range at which data can be accurately and reliably transmitted. System 300 removes the skew from the individual bits comprising each of the received data words. This allows system 300 to transmit across much longer distances than possible in the prior art (e.g., in a HIPPI 6400 implementation, 50 meters where the communications channels are copper wires, and 1 kilometer where the communications channels are fiber optic).

The system of the present invention solves the propagation delay problem of the communications channels 0–3 by electronically "padding" each channel so that the individual arrival times appear to be equal. In the present embodiment, the "padding" of each communications channel is accomplished by inserting an additional amount of delay through the use of a delay line and multiplexer (e.g., delay stack) structures. Each of the communications channels (e.g., channels 0–3) are coupled to the delay stack structure 303, where they are individually "programmed" to insert the proper amount of delay for skew compensation. The signals from the communications channels subsequently emerge from delay stack structure 303 as data outputs d0–d3. Hence, while a data word is skewed as it enters delay stack structure 303, it is de-skewed as it emerges on data outputs d0–d3. The system of the present invention functions in the same manner whether the communications channels are fiber optic or metal.

Figure 10:
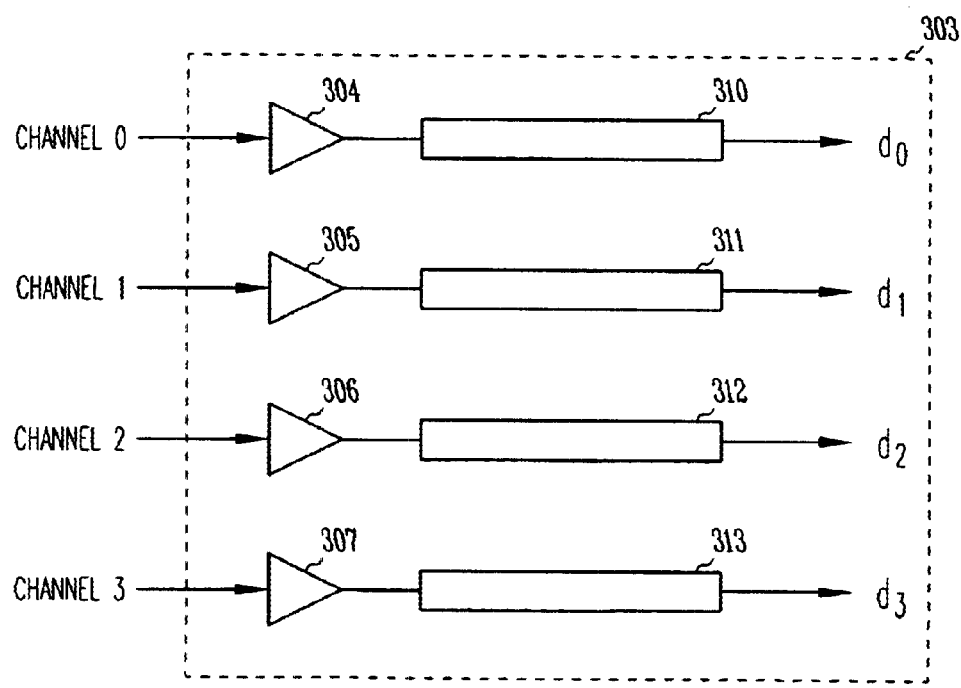
FIG. 10 shows the delay stack structure from FIG. 9 in greater detail.

Referring now to FIG. 10, the delay stack structure 303 is shown in greater detail. Communications channels 0–3 are respectively coupled to channel inputs 304 through 307. Channel inputs 304–307 are subsequently coupled to a delay line included within each of delay stacks 310 through 313. The outputs of the delay stacks 310–313 become data outputs d0–d3.

The bits of an incoming word are received at channel inputs 304–307. As described above, these bits arrive in a skewed condition. The bits are transmitted to delay stacks 310–313 via channel inputs 304–307. The delay stacks 310–313 function by adding a precise amount of delay to each bit of the word. This precise delay is such that the total amount of delay of each communications channel plus its respective delay stack for each of the bits is substantially the same. In so doing, the bits are effectively de-skewed. The resulting bits of the word are output via data outputs d0–d3.

Figure 11:
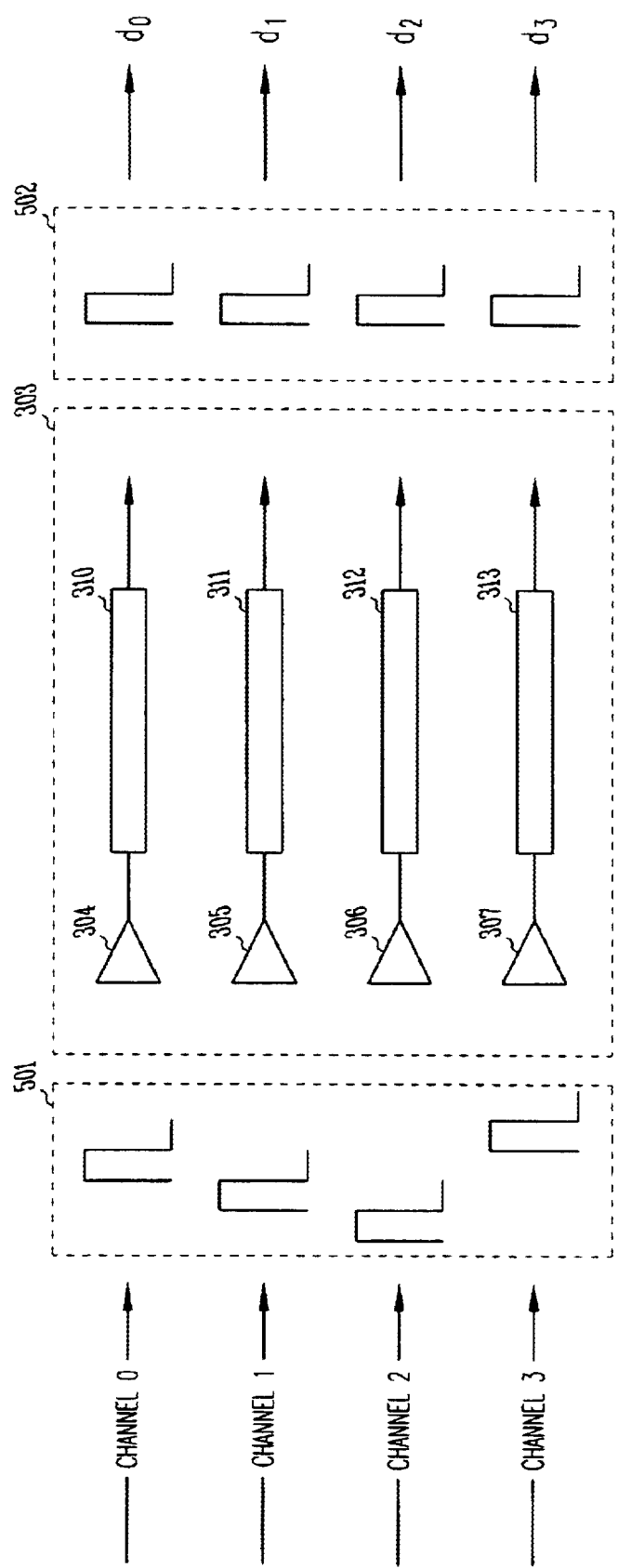
FIG. 11 shows a diagram of a de-skewing operation in accordance with the present invention.

FIG. 11 shows a diagram of the de-skewing operation. Delay stack structure 303 receives an incoming word 501 (e.g., 1111). The bits of word 501 are skewed. This distortion is generally referred to as skew, and is represented in FIG. 11 by the different arrival times of the bits of word 501. The skew, as discussed above, leads to difficulty in accurate sampling. The system of the present invention, however, removes the skew prior to sampling. Delay stack structure 303 de-skews the bits and outputs word 502 via outputs d0–d3. Hence, while the bits of word 501 were not synchronous upon arrival from transmitter 301, they emerge synchronously from outputs d0–d3 as word 502. Word 501 is de-skewed by delay stack structure 303 and word 502 is output without skew distortion.

Figure 12:
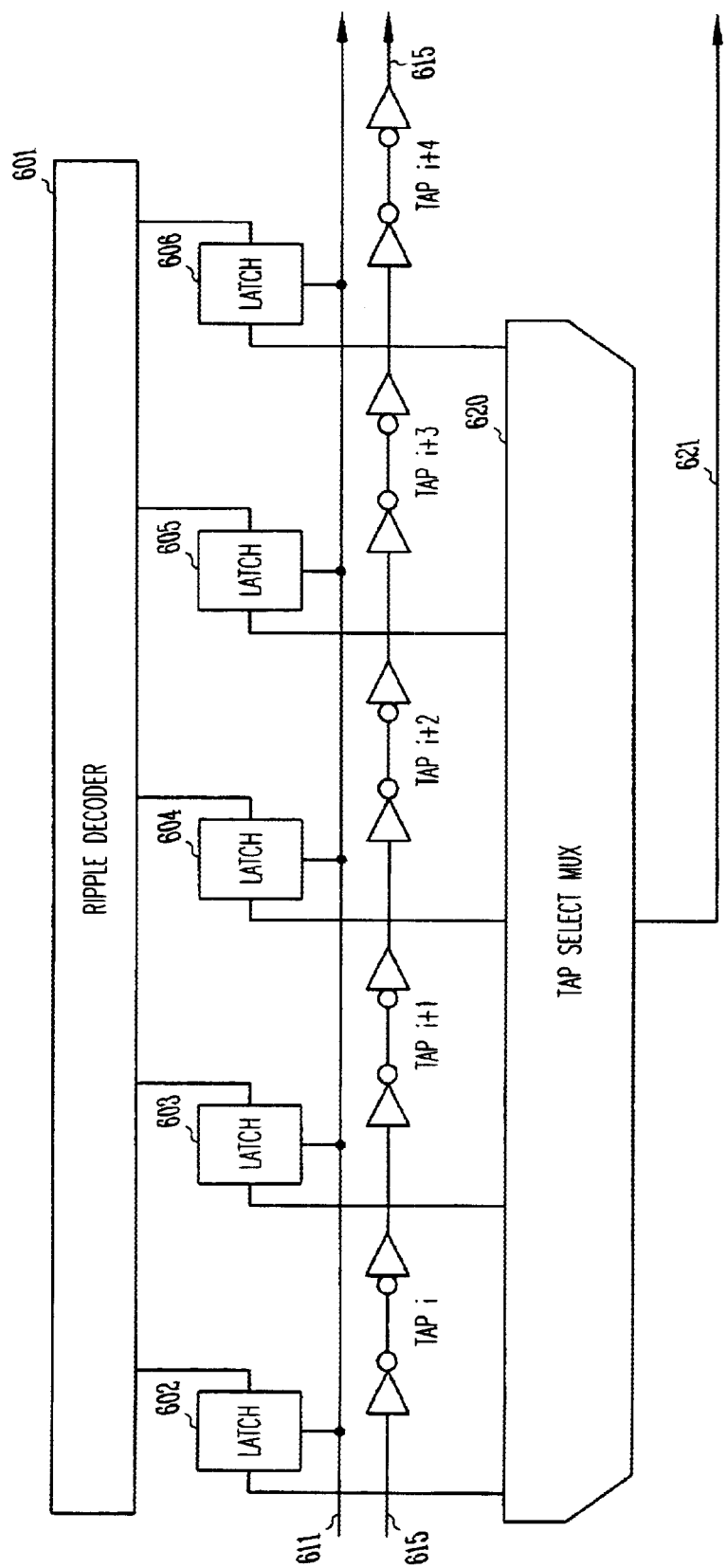
FIG. 12 shows a delay stack in accordance with one embodiment of the present invention.

Referring now to FIG. 12, a delay stack 310 in accordance with one embodiment of the present invention is shown. Delay stack 310 is one of delay stacks 310–313 in delay stack structure 303 (from in FIG. 11). Delay stack 310 includes a ripple decoder 601, a plurality of latches 602–606, a delay line 615, and a tap select multiplexer 620.

As described above, delay stack 310 functions by adding an additional amount of delay to a signal received from channel input 304 such that output d0 is de-skewed with respect to the other outputs. Delay line 615 is coupled to channel input 304 to receive signals from channel 0. Delay line 615 is includes a series of "taps". In the present embodiment, each tap is comprised of two back to back inverters and is numbered tap i, through tap i+1, tap i+2, and so on, for a total of N taps.

The inverters comprising each tap are precisely fabricated to be as close a copy as possible to each other inverter, and thus, provide the same amount of delay. Accordingly, each tap (e.g., tap i) provides the same amount of delay as another tap (e.g., tap i+1) within delay line 615. The signal from channel input 304 is coupled to delay line 615 on the left of FIG. 12 and is conducted through the taps, toward the right. Each tap adds its precise amount of delay. Hence, the proper amount of delay is added by selecting the proper tap output.

For example, where three tap delays are required to de-skew channel 0, the tap select multiplexer 620 selects tap i+2. Tap select multiplexer implements a signal path from channel input 304 to the output of tap i+2, to output line 621. As the signal from channel 0 proceeds through delay line 615, it is routed from the output of tap i+2 to output line 621 to become output d0. In this manner, delay line 615 and tap select multiplexer 620 can add variable amounts of delay such that as the skew of channel 0 varies, output d0 is continually de-skewed.

The total amount of delay which can be added is determined by the delay of a single tap and the number of taps included in delay line 615. Although FIG. 12 only shows taps i through i+4, it should be appreciated that delay line 615 includes N number of taps, where N encompasses the longest skew delay line 615 is likely to see. In addition, it should be noted that delay is added incrementally, with a granularity equal to the delay of each additional tap.

Thus, the amount of delay which can be added is variable such that delay stack 310 can continually compensate for the variable skew on input channel 0. To determine the amount of delay to add, delay stack 310 periodically measures the amount of skew present. This is accomplished through the use of a special "ping" sequence.

During normal operation, (e.g., in a HIPPI implementation of the present invention) receiver 302 processes normal data comprised of micropackets. A micropacket is the basic transfer unit from a HIPPI compliant transmitter (e.g., source) to a HIPPI compliant receiver (e.g., destination). A "normal" micropacket is typically comprised of 32 data bytes and 64 bits of control information. At 6400 Mbit/sec, a normal micropacket is transmitted every 40 ns. Hence, during normal operation, the traffic conveyed by delay stack structure 303, and therefore delay stack 310, are the data words comprising the normal micropackets. Periodically, however, a training micropacket is sent to enable delay stacks 310–315 to re-characterize the skew of their respective channels. Each training micropacket includes the special ping sequence. The propagation of this ping sequence through each of the delay stacks 310–315 is utilized by the present invention to determine the relative skew for each channel, and hence, the proper amount of delay to add.

The ping sequence is transmitted from transmitter 301 via channels 0–3 to receiver 302 and each of delay stacks 310–315. In delay stack 310, the ping sequence is coupled to delay line 615 from channel input 304. The ping sequence subsequently "propagates" through delay line 615, through each successive tap. Correspondingly, the ping sequence also propagates through each other delay stack (e.g., delay stacks 311–313) in the same manner. Due to the skew present in channels 0–4 however, the ping sequence arrives at some delay stacks prior to others. Accordingly, the ping sequence propagates further through the delay lines of the delay stacks first entered than through those last entered. The controller 320, by precisely timing the opening and the closing of the latches coupled to their respective delay lines, uses each of delay stacks 310–313 to determine how far the ping sequence propagates through their respective delay lines, and thus, determine the skew of their respective channels.

In delay stack 310, for example, just prior to the arrival of the ping sequence, controller 320 opens latches 602–606 via control line 607. Subsequently, as the ping sequence propagates through each successive tap, its passing is registered in the latches 602–606 coupled to the outputs of each respective tap. As the ping sequence passes from the output of tap i to tap i+1, latch 603 registers its passing. As the ping passes from tap 1+1 to tap i+2, latch 604 registers its passing, and so on. Once the ping sequence on the slowest of channels 0–3 has entered its respective delay line, controller 320 generates an All_Present signal, which closes the latches 602–606 of each of delay stacks 310–313. Consequently, when All_Present asserts, the latches take a snap shot of the instant contents of all the delay lines and saves this information for later use.

In this manner, in delay stack 310, latches 602–606 store the progress of the ping sequence as it rippled down delay line 615 (and likewise in the delay lines of delay stacks 311–313). Those taps through which the ping sequence passed have a logical one stored in their respective latches, while those taps not reached by the ping sequence prior to the All_Present signal have a logical zero stored in their latches. The outputs of the latches 602–606 are coupled to ripple decoder 601. Ripple decoder 601 analyzes each of the outputs to determine the progress of the ping sequence. The furthest tap through which the ping sequence rippled indicates the particular tap output to select in tap select multiplexer 620, which, in turn, controls the amount of delay to be added to channel 0.

For example, where latch 604 was the last latch to register the ping sequence (e.g., by storing a logical one), ripple decoder 601 selects the output of tap i+2 in tap select multiplexer 620, thus coupling the output of tap i+2 to output line 621 and selecting the proper amount of delay to add to channel 0. For example, in the present embodiment, as ripple select decoder 601 analyzes the contents of the latches, it selects the tap corresponding to the first 0 from beginning of delay line 621 (as opposed to the last 1). The output of this tap is coupled to d0. In this manner, each of delay stacks 310–313 select their respective amount of delay to add to their respective channels. Hence, when the training sequence is complete and system 300 proceeds to normal operation, the signals of channel 0 proceed through delay line 615, through tap i+2, and out through output line 621.

In this manner, each of delay stacks 310–313 add their respective amount of delay. Thus, the data words emerging from delay stack 303 are de-skewed (e.g., word 502). Each successive normal micropacket (e.g., each data word) is received, de-skewed, and output. Each of delay stacks 310–313 compensate for skew in their respective communications channels. The tap select multiplexers within each of the delay stacks 310–313 form variable signal paths from their channel inputs to their data outputs, the signal paths varying to include the number of taps necessary to yield the proper amount of delay for their respective communications channels. In so doing, system 300 accurately and reliably compensates for skew distortion, thereby providing for the reliable parallel transmission and reception of data across much longer distances than possible with prior art systems.

It should be appreciated that while in the present embodiment, each tap (e.g., tap i) is comprised of a pair of inverters, the system of the present invention is suited to the use of taps comprised of other delay elements. The taps of the present invention, for example, could be comprised of OR gates. Inverters were selected due to their delay characteristics, compact size, and ease of fabrication. However, different delay elements can be utilized while remaining within the scope of the present invention.

Figure 13:
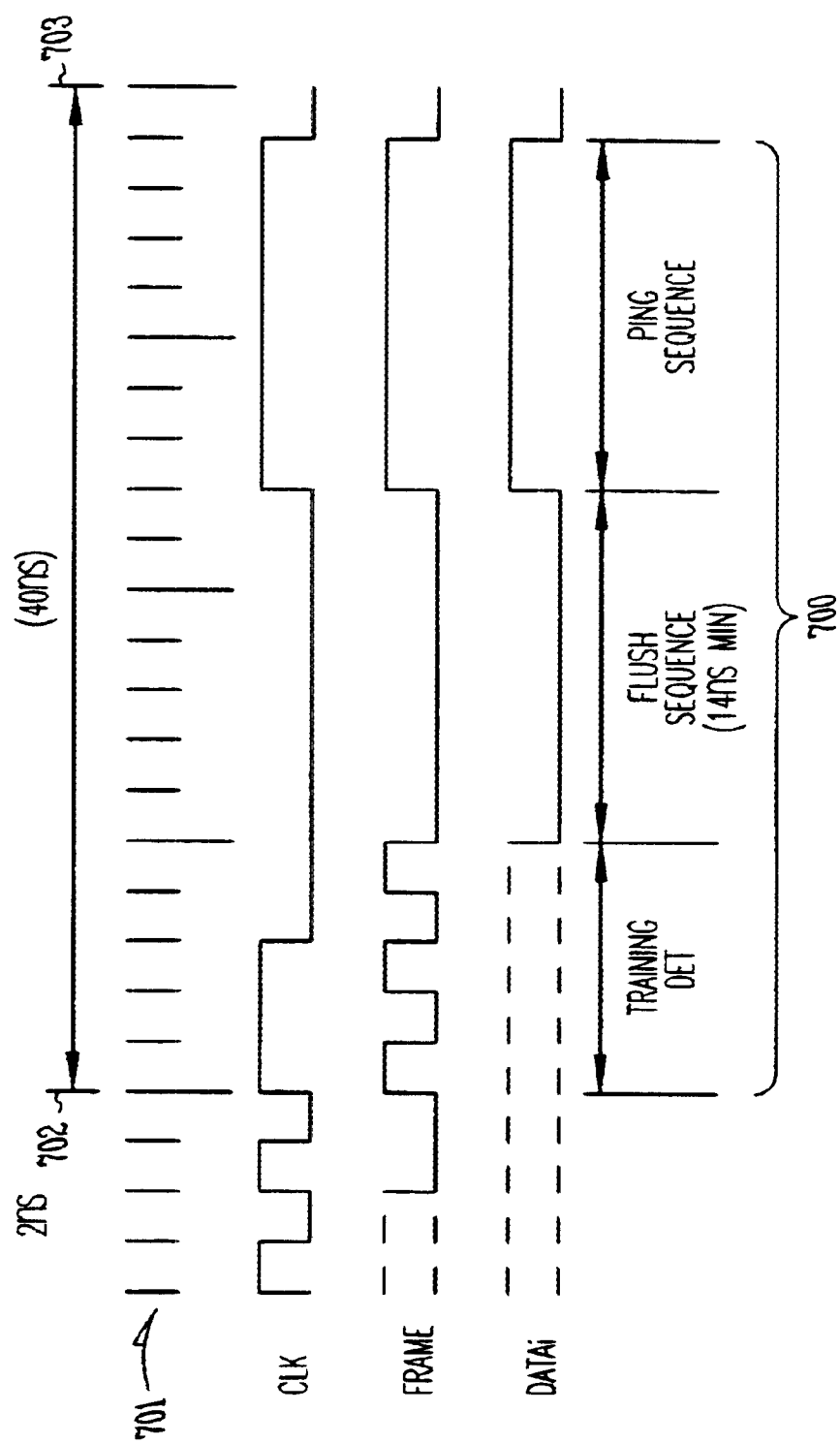
FIG. 13 shows a training micropacket in accordance with one embodiment of the present invention.

With reference now to FIG. 13, a training micropacket 700 (e.g., at transmitter 301 from FIG. 9) in accordance with one embodiment of the present invention is shown. Training micropacket 700 is shown with respect to a time line 701. In accordance with the HIPPI specification, training micropacket 700 is 40 ns long, extending from time 702 to time 703. Training micropacket 700 includes a training detection sequence, a flush sequence, and a ping sequence. The signals CLK, Frame, and DATA i (one of 20 parallel data signals) are shown.

As described above, during normal operation, normal micropackets in accordance with the HIPPI specification are transmitted from transmitter 301 to receiver 302. The data words comprising the micropackets are de-skewed in accordance with the system of the present invention. As the skew present in the communications channels varies over time, the system of the present invention periodically "retrains" each of delay stacks 310–313 through the use of training micropackets (e.g., training micropacket 700) in the manner described above. The time period where a training micropacket (e.g., training micropacket 700) is received and processed is referred to as a training period.

The training detect sequence of training micropacket 700 functions by alerting controller 320 that the present micropacket is a training micropacket and that the present 40 ns period is a training period, thus preparing system 300 for retraining. In normal micropackets, in accordance with the HIPPI specification, the Frame signal is high for the first 20 ns of the period and low for the last 20 ns, while the CLK signal alternates every 2 ns. During the first portion of the training micropacket, however, CLK is driven high for 6 ns and then driven low, while Frame is alternately driven high and low every 2 ns. This alerts controller 320 to the fact that the present micropacket is a training micropacket. In response, the latches of the respective delay stacks 310–313 are opened by controller 320 in preparation for the ping sequence.

Preceding the ping sequence is the flush sequence. In the present embodiment, the flush sequence is 14 ns long, and functions by flushing the delay lines of the respective delay stacks 310–313 with logical zeros in preparation for the ping sequence. The last portion of training micropacket 700 is itself the ping sequence, where all the channels 0–3 are driven high, sending logical ones down each of the channels 0–3 and into each respective delay stack 310–313. The "edge" of the ping sequence is synchronous in time across each of the channels (e.g., at the transmitter 301 end). Prior to the end of the ping sequence, each of channels 0–3 are driven low in preparation for the next micropacket.

Figures 14, 15:
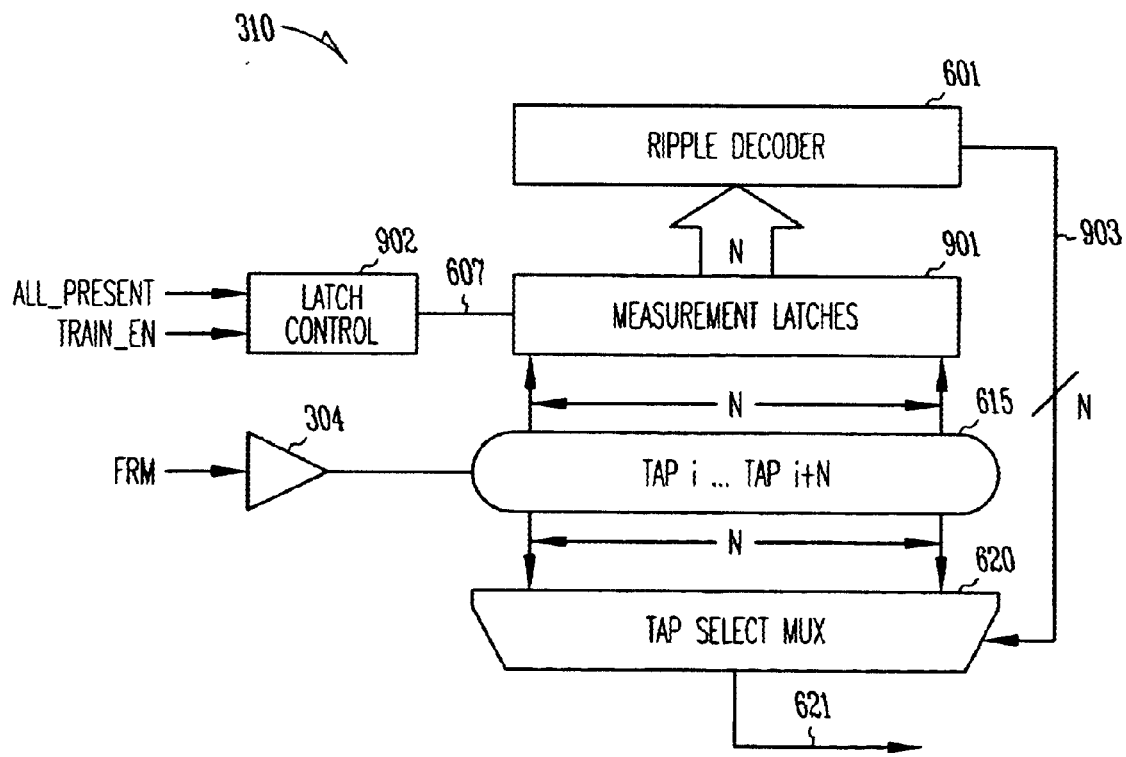
FIG. 14 shows a diagram illustrating the progress of a ping sequence through each of the delay lines of one embodiment of the present invention, with respect to the output of their respective latches.
FIG. 15 shows a delay stack in accordance with one embodiment of the present invention in greater detail.

Referring now to FIG. 14, a diagram 800 is shown representing the progress of the flush sequence and the ping sequence through each of the delay lines (e.g., delay line 615 of delay stacks 310, 311, and 312, corresponding to channels 0, 1, and 2. The output of the respective latches for channels 0, 1, and 2 are shown. A "1" indicates that particular latch registers a logical one, indicating the ping sequence has rippled past its input, while a "0" indicates the ping sequence has not yet reached that particular latch. An "X" means the output is indeterminate, as that particular latch is in the process of changing from a "0" to a "1".

Hence, diagram 800 shows that channel 0 is a particularly fast channel. The ping sequence has propagated further down its respective delay line than the other channels. Hence, channel 0 has the largest amount of additional delay added. Channel 1 is slower than channel 0 but faster than channel 2. Its additional delay is sized accordingly. Channel 2 is a particularly slow channel. It is the last channel to receive the ping sequence, and therefore, shows the shortest length of propagation. Accordingly, its added amount of additional delay is the smallest. In addition, the arrival of the ping sequence in channel 2, the last channel to receive it, leads to the subsequent assertion of the all present signal by controller 320. As described above, this signal closes all the latches, resulting in a "snapshot" of the relative skew of the channels, as shown in diagram 800. The latches, at the time the all present signal is asserted, save the state of their respective delay lines. The system of the present invention, in the manner described above, uses the information stored in the latches to configure each of the multiplexers in each of the delay stacks 310–313.

Thus, as shown by diagram 800, it is important that each of the delay lines is long enough (e.g., includes a large enough number of taps and their respective latches) so that the leading edge of the ping sequence for the fastest channel (e.g., channel 0) is still within its delay line when the leading edge of the ping sequence arrives at the slowest channel (e.g., channel 2). Hence, in the present embodiment, the system of the present invention includes delay lines having 160 taps.

With reference now to FIG. 15, a delay stack 310 in accordance with one embodiment of the present invention is shown in greater detail. The measurement latches from FIG. 12 (e.g., latches 602–606) are contained within measurement latches 901. Measurement latches 901 contain N number of latches corresponding to N number of taps in delay line 615. The measurement latches 901 are coupled to ripple decoder 601 via N lines. In the present embodiment, 160 taps are included in each delay line (hence, N equals 160). A latch control circuit 902 controls the opening and closing of measurement latches 901 through latch enable line 607. Latch control circuit 902 accepts as inputs the all present signal and a train enable signal train_en from controller 320. The ripple decoder 601 controls the tap select multiplexer via control lines 903.

Figure 16:
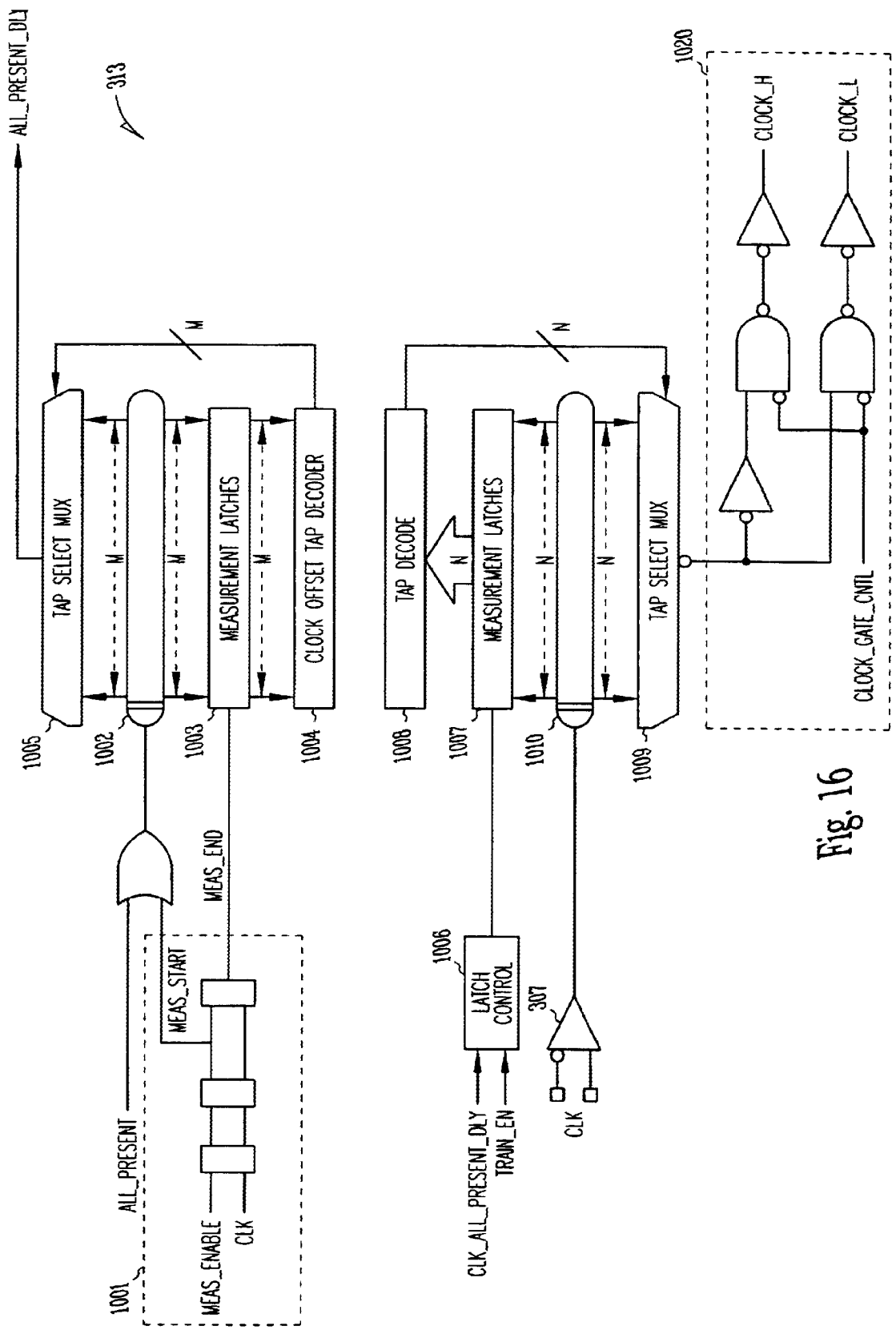
FIG. 16 shows a delay stack for the communications channel which conveys the clock signal, in accordance with one embodiment of the present invention.

Referring now to FIG. 16, a delay stack 313, for the clock signal, in accordance with one embodiment of the present invention is shown. Delay stack 313, and hence, channel 3, convey the clock signal CLK for system 300. The clock signal, in accordance with the HIPPI specification, is transmitted across one of the communications channels (channel 3 in the present example) and is used in sampling the data on the rest of the communications channels. However, the clock signal, as is each of the other signals, is skewed. The clock signal could be processed along with the rest of the signals in delay stack structure 303, such that their respective rising edges are skew compensated. This would not be desired due to the fact that the other signals (e.g., DATA) conveyed by the communications channels are sampled with respect to both edges of the clock signal. Lining the edges of the clock signal up with the edges of the other signals makes them sample indeterminately. Thus, the system of the present invention adds an additional amount of delay to the clock signal such that it lines up correctly with respect to the other signals. This feature is referred to as clock edge placement.

To implement the first step of clock edge placement, delay stack 313 measures the clock period. Clock period measurement is performed by logic circuit 1001. At the start of the clock period, logic circuit 1001 sends a measurement start signal meas_start down a delay line 1002. At the end of the clock period, logic circuit 1001 sends a measurement end signal meas_end to the measurement latches 1003, causing them to close, taking a snapshot of the measurement start signal as it propagates down delay line 1002.

To implement the second step of clock edge placement, a clock offset tap decoder 1004, then divides the measured clock period by four. The divide by four result is desired due to the fact that both the rising edge and the falling edge of the clock signal is used to sample data. As such, an additional ¼ clock period of delay is required. Measurement latches 1003 now contain the snapshot of the meas_start signal as it propagated down delay line 1002. This snap shot represents the delay of one complete cycle of the clock signal CLK. Thus, to divide the clock signal by four, clock offset tap decoder 1004 examines every fourth tap to select a delay amount equal to ¼ clock period. The clock offset tap decoder configures a multiplexer 1005 accordingly to generate the signal All_Present_Dly.

To implement the last step of clock edge placement, delay stack 313 uses the All_Present_Dly signal to inject an additional delay equal to ¼ clock period into the delay line 1010. Whereas the other delay stacks (e.g., delay stack 310) used the All_Present signal to close their latches, delay stack 313 uses the All_Present_Dly signal via latch control circuit 1006 to close measurement latches 1007. Thus, at a precise time, ¼ clock period later than the other delay stacks, measurement latches 1007 closes. This takes a snapshot of the skew present in channel 3 (e.g., the clock signal) as the ping sequence propagates down delay line 1010 plus precisely ¼ clock period more time. A tap decoder 1008 uses this information to configure a multiplexer 1009 to select precisely the amount of delay for channel 3, thus implementing proper clock edge placement.

Delay stack 313 also includes a clock gate control circuit 1020. Clock gate control circuit 1020 functions by preventing data from the training sequence from passing through to other circuits. Clock gate control circuit 1020 receives as an input a clock_gate_cntl signal from controller 320. The outputs of clock gate control circuit 1020 are CLOCK_H and CLOCK L, which are clock signals of opposite phase. When the training period is complete, the clock_gate_cntl signal is deasserted, enabling the CLOCK_H and CLOCK_L outputs.

Figure 17:
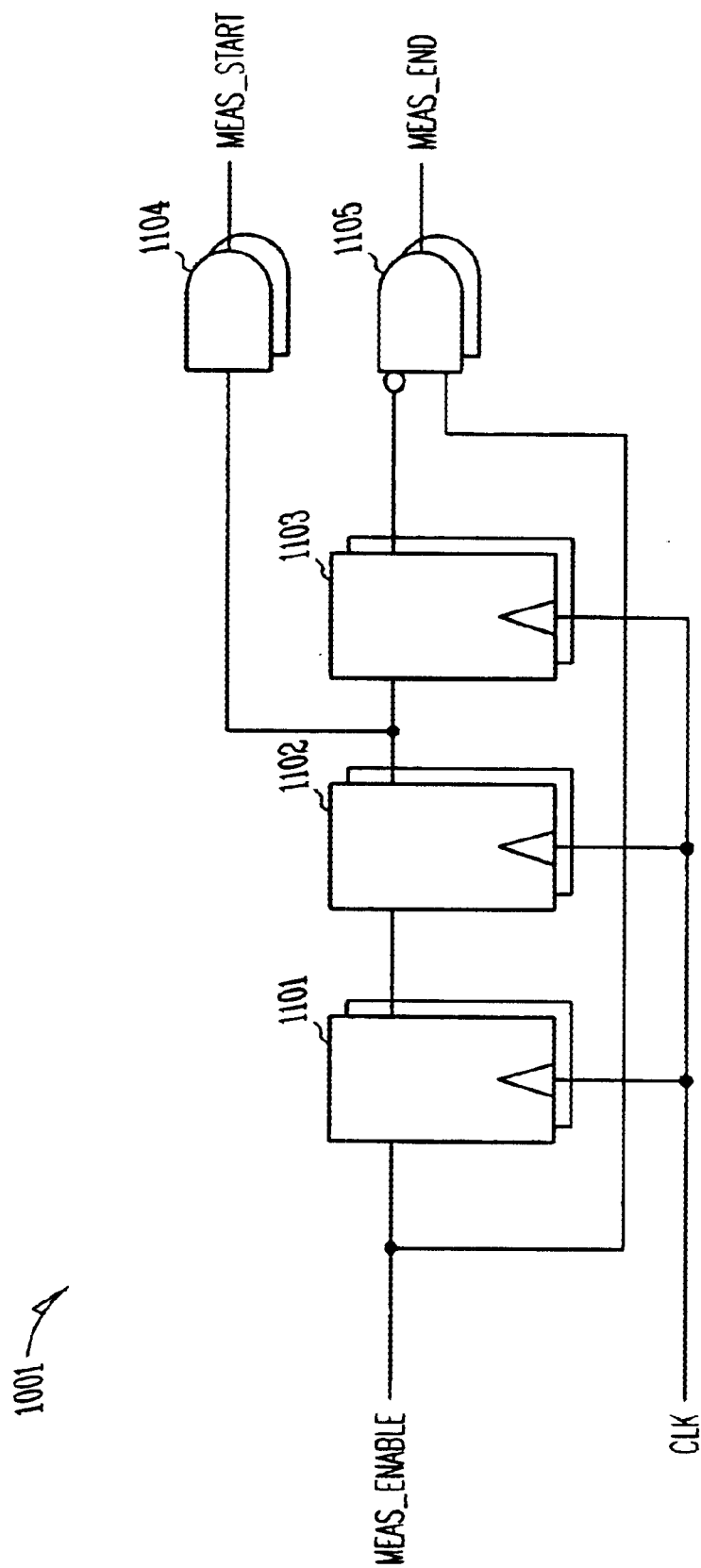
FIG. 17 shows a logic circuit for measuring the period of the clock signal, in accordance with one embodiment of the present invention.

FIG. 17 shows the logic circuit 1001 in accordance with one embodiment of the present invention in greater detail. Logic circuit 1001 includes a flip flop 1101, a flip flop 1102, and a flip flop 1103. Flip flop 1101 accepts a meas_enable signal from controller 320 as an input and has its output coupled to the input of flip flop 1102. The output of flip flop 1102 is coupled to an AND gate 1104. The output of flip flop 1103 is inverted and coupled to an AND gate 1105. AND gate 1105 also accepts the meas_enable signal from controller 320 as an input. AND gate 1104 is included within logic circuit 1001 to balance the timing of meas_start with meas_end.

Figure 18:
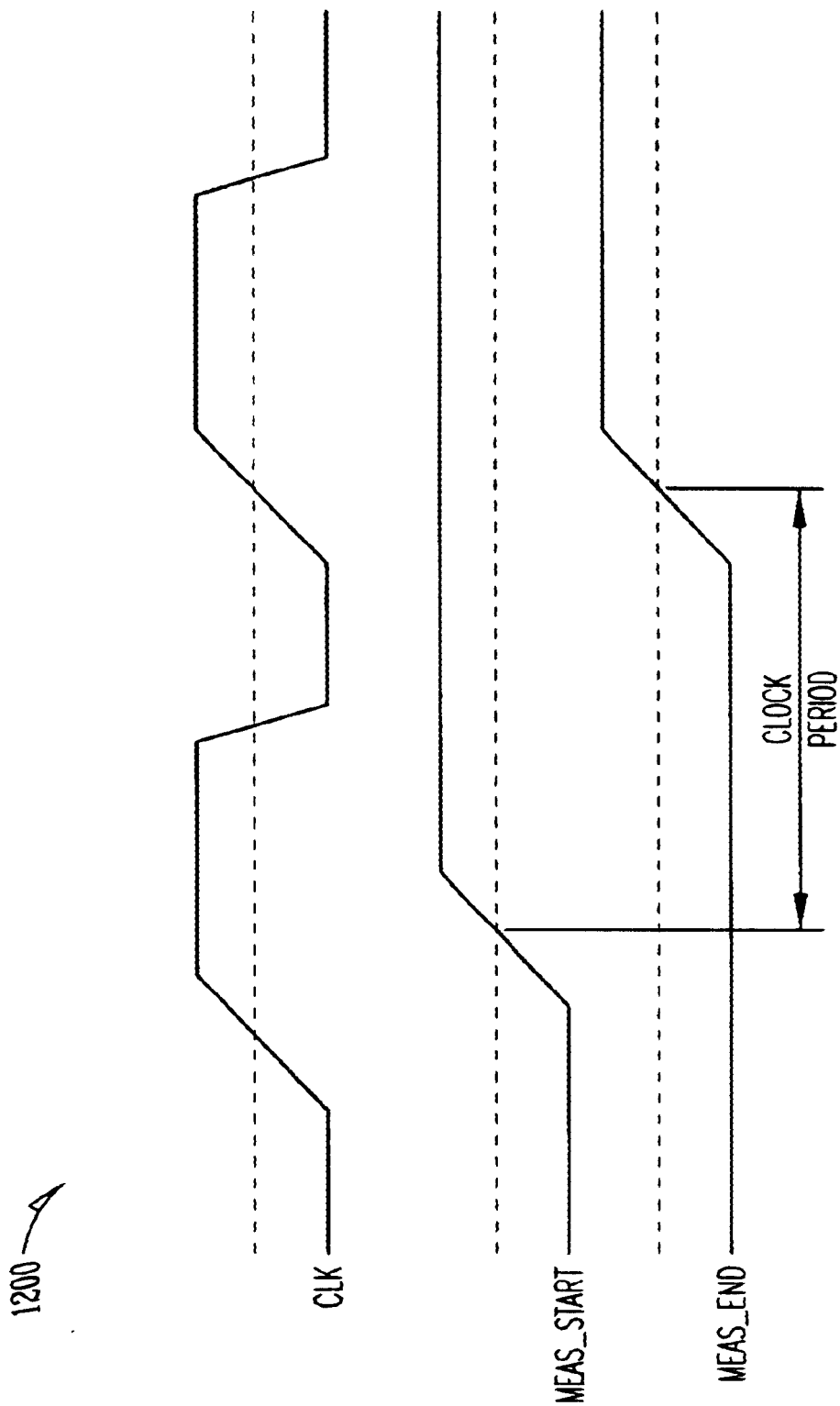
FIG. 18 shows a timing diagram illustrating the operation of the logic circuit from FIG. 17.

FIG. 18 shows a timing diagram 1200 illustrating the operation of logic circuit 1001. The rise and fall times of the signal CLK have been exaggerated to show the benefit of measuring a full clock cycle. The first two flip flops, 1001 and 1102 function by synchronizing the meas_enable signal to the CLK signal to generate the meas_start signal. This signal is coupled to delay line 1002. The meas_start signal propagates down the delay line until the very next rising edge of CLK, which generates the meas_end signal. This closes the latches, storing the state of the delay line 1002 at that instant. In this manner, logic circuit 1001 measures the period of CLK.

It should be appreciated that in order for logic circuit 1001 and delay line 1002 to measure the clock period CLK, receiver 302 needs to be receiving normal micropackets. As described above, during a training micropacket, the channels are alternating (e.g., a flush sequence followed by a ping sequence). Thus, the clock period cannot be measured during the training micropackets. Hence, delay stack 313 includes two delay lines, delay line 1002 and delay line 1010. During normal operation, delay line 1002, in conjunction with logic circuit 1001, measures the period of CLK and determines the proper ¼ clock delay. Meanwhile, delay line 1010 handles the normal skew compensation of the CLK signal on channel 3. During training periods, however, delay line 1010 determines the proper amount of skew compensation for channel 3 and, through the ¼ clock delay of All_Present_Dly, adds the additional ¼ clock period for clock edge placement. Hence, during normal operation, delay line 1002 is used to measure the CLK period and during training periods delay line 1002 is used to inject the ¼ clock period delay into delay line 1010.

In addition, it should be appreciated that upon system 300 power up, before meaningful data can be transmitted and received, receiver 302 needs to receive a normal micropacket in order to properly perform clock edge placement. Once the clock period has been measured and the clock edge placed, the receiver can train each of delay stacks 310–313 for proper skew compensation. Consequently, at system 300 power up, transmitter 301 sends normal micropackets alternating with training micropackets until receiver 302 is properly trained and is ready for normal operation.

Figure 19:
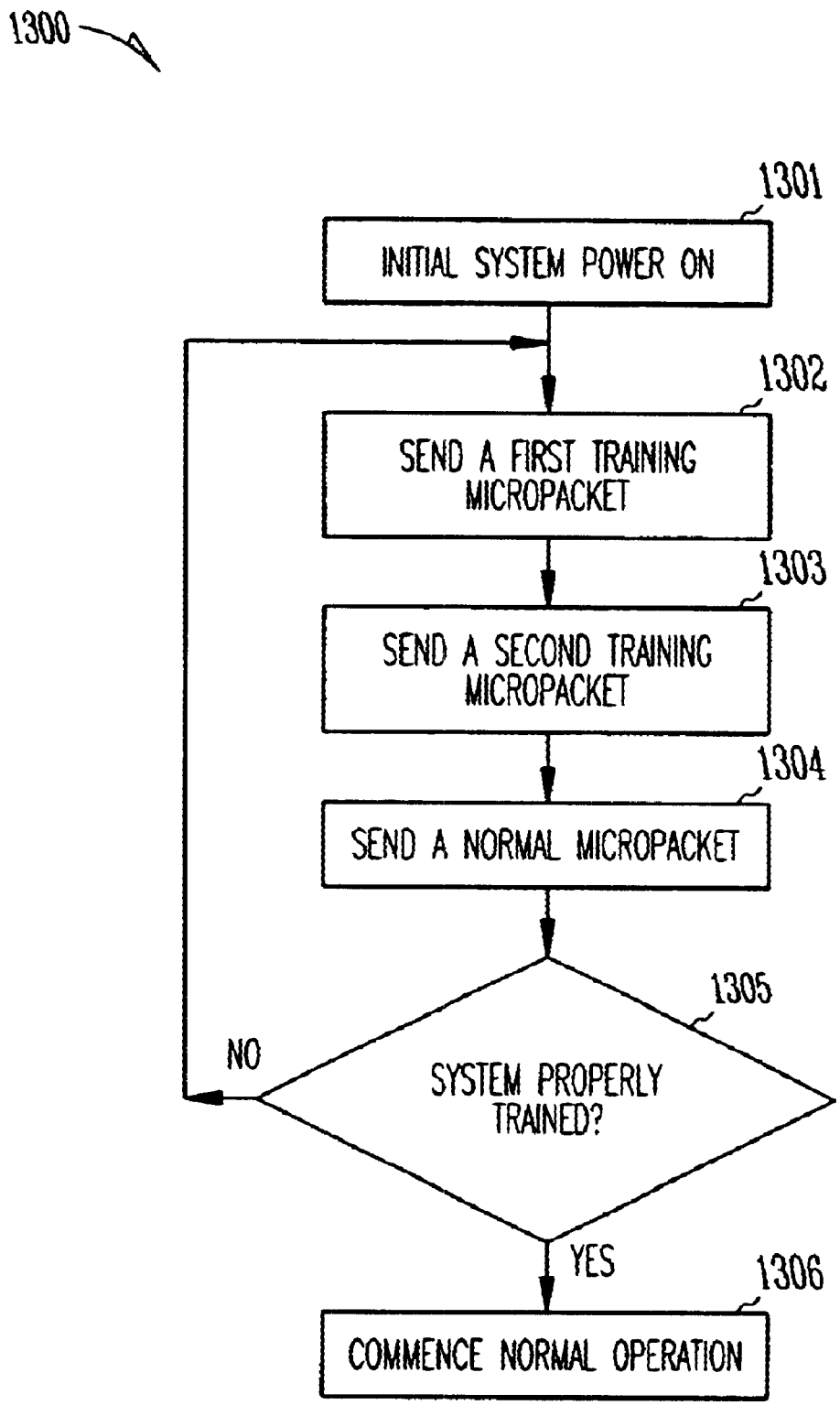
FIG. 19 shows a flow chart of the steps of a process in accordance with one embodiment of the present invention.

With reference now to FIG. 19, a flow chart of the steps of a process 1300 in accordance with one embodiment of the present invention is shown. Process 1300 illustrates steps a system in accordance with a HIPPI implementation of the present invention (e.g., system 300 from FIG. 9) proceeds through from initial power on to normal operation. As such, processes in accordance with different implementations may include different steps, yet still remain within the scope of the present invention.

Process 1300 begins in step 1301, where the system of the present invention initially powers up. At initial power up, the delay compensation in the delay stack structure (e.g., delay stack structure 303) is not adjusted. Accordingly, no meaningful data can be transmitted or received until the system characterizes the delay on the various communications channels (e.g., channels 0–3).

In step 1302, the transmitter (e.g., transmitter 301) sends a training micropacket as part of an initial training sequence. As described above, the training micropacket includes a training detect sequence, a flush sequence, and a ping sequence. Each delay stack (e.g., delay stack 310) of the delay stack structure measures the propagation of the ping sequence down their respective delay lines (e.g., delay line 615 from FIG. 12). As the ping sequence propagates down the delay lines, latches within each delay stack record its progress. Once the ping sequence has reached all the delay lines (e.g., the ping sequence having propagated through the slowest channel) a controller (e.g., controller 320) generates an All_Present signal which closes the latches of each of the delay stacks. As described above, each delay stack uses the information stored in the latches to de-skew its respective channel.

In step 1303, the transmitter sends another training micropacket to retrain each of the delay stacks. This second training micropacket is sent immediately after the first training micropacket sent in step 1302. This allows the system of the present invention to readjust the compensation in each delay stack, in case of error. As described above, however, in order to complete the training process, the transmitter needs to send a normal (i.e., non-training) micropacket having a normal clock signal (e.g., CLK).

In step 1304, the transmitter sends a normal micropacket to the receiver. This normal micropacket, as described above, has a normal clock signal. Thus, the delay stack coupled to the channel conveying the clock signal (e.g., channel 3) utilizes a logic circuit (e.g., logic circuit 1001 from FIG. 16) to measure the period of the clock signal. This period is subsequently used to inject an additional amount of delay into the channel's delay line (e.g., delay line 1010) in order to accomplish clock edge placement. Clock edge placement, as described above, results in the edges of the clock signal being placed such that the de-skewed data emerging from the outputs (e.g., outputs d0–d3) of the receiver can be sampled synchronous with the clock signal's rising and falling edges.

In step 1305, the system of the present invention determines whether it has been properly trained. For proper training, the skew compensation should have been correctly set in steps 1302 and 1303, and the clock period should be correctly measured for clock edge placement in step 1304. The system detects whether the skew compensation is correct and whether the clock edge placement is correct. If not, process 1300 loops back to step 1302. If the system is properly trained, process 1300 proceeds to step 1306. Hence, the system continually sends a series of two training micropackets followed by a normal micropacket until proper training is accomplished.

In step 1306, the system of the present invention commences normal operation. The delay stacks (e.g., delay stacks 310–313) de-skew the incoming data words of the normal micropackets (e.g., data word 501 from FIG. 11), producing de-skewed data words (e.g., data word 502). The normal data words are transmitted and received at the rate of 1 every 2 ns, yielding a data throughput of 500 Mbit/sec per channel.

It should be appreciated that during normal operation, the system of the present invention periodically retrains itself to adjust for skew components which vary with time. In one embodiment, for example, a programmable retraining timer periodically sends training micropackets to adjust for skew at programmable intervals. Between the intervals of the retraining timer, normal micropackets are transmitted. In addition, a retraining micropacket is sent when a transmission error is detected.

Figure 20:
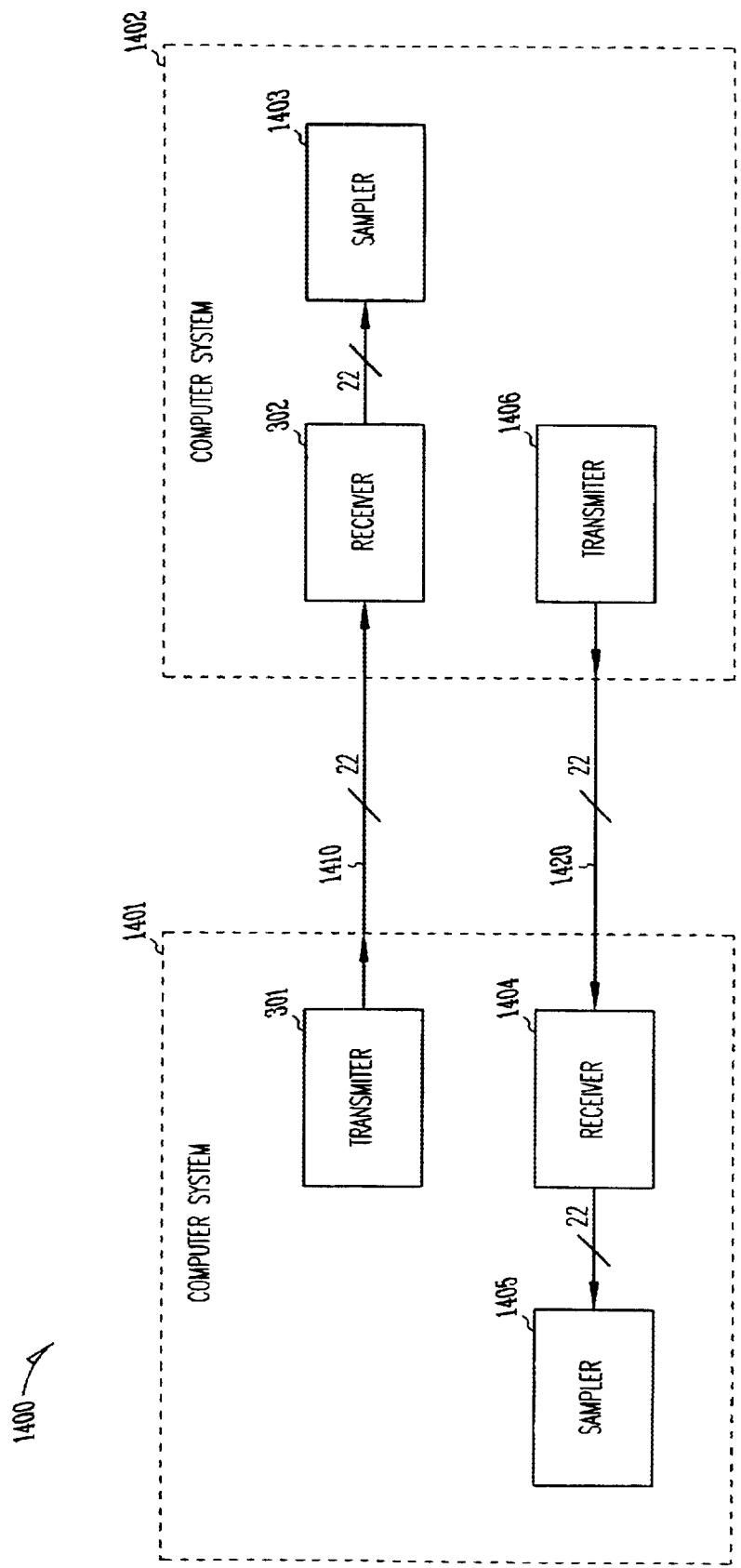
FIG. 20 shows a diagram of a 20 bit data communications system in accordance with one embodiment of the present invention.

Referring now to FIG. 20, a 16 bit HIPPI data communications system 1400 in accordance with one embodiment of the present invention is shown. System 1400 includes a computer system 1401 and a computer system 1402. Computer system 1401 includes the transmitter 301, a receiver 1404, and a sampler 1405. Computer system 1402 includes the receiver 302, a sampler 1403 and the transmitter 1406. As described above, transmitter 301 and receiver 302 comprise one direction of data transfer. Transmitter 1406 and receiver 1404 comprise the opposite direction of data transfer. Data is transmitted from computer system 1401 to computer system 1402 via the 22 communications channels of wires 1410. Similarly, data is transferred from computer system 1402 to computer system 1401 via the 22 communications channels of wires 1420. The wires 1410 and wires 1420 together comprise a HIPPI parallel data transfer cable, each communications channel being a shielded copper wire pair.

Receiver 302, as described above, de-skews data words received via wires 1410. The resulting de-skewed data words are subsequently coupled to sampler 1403 where they are sampled and interfaced to the internal busses of computer system 1402. In the present embodiment, receiver 1404 and transmitter 1406 are the same as receiver 302 and transmitter 301, except for the fact that data transfer is in the opposite direction. Sampler 1405, in the same manner as sampler 1403, samples the de-skewed data words from receiver 1404 and interfaces them with the internal busses of computer system 1401. Thus, system 1400 provides for full duplex, de-skewed, reliable data transfer at 6400 Mbit/sec in each direction, at distances of up to 50 meters (e.g., in the present embodiment, a HIPPI 6400 implementation).

Thus, the present invention, a method and system for de-skewing parallel bus channels, provides a method and system which overcomes the limitations of prior art parallel data transmission and reception. The system of the present invention accurately and reliably compensates for skew distortion, thereby providing for the reliable parallel transmission and reception of data across much longer distances than possible with prior art systems. The present invention realizes higher data transmission rates over a given distance than possible with prior art systems. Additionally, the present invention maximizes the available bandwidth of each channel and does not require extensive and complex testing to characterize propagation delay, or excessively interrupt data transmission for channel testing.

The following is an exemplary verilog embodiment of a controller (e.g., controller 320) in accordance with one HIPPI implementation of the present invention:

```
// $Id: dsc_cntl.v /main/18 1997/06/26 18:13:45 GMT
module dsc_cntl (CLK_500MHZ_H
        ,CLK_500MHZ_L
            ,SUMAC_RESET_L
            ,SIM_RESET_L
            ,DSC_ENB
            ,AC_WIDTH16
            ,CLK_IN
            ,CLK_OUT
            ,ALL_PRESENT
            ,SCAN_GATE
            ,LSSD_A
            ,LSSD_B
            ,LSSD_C
            ,LSSD_SI
            ,TRAIN_ENB
            ,TRMN_ENB_DLY
            ,ENB_CLK_OUT
            ,NORM_UPKT
```

```
                ,MEAS_CLK_PER_8B
                ,MEAS_CLK_PER_16B
                ,LSSD_SO
                );
input     CLK_500MHZ_H;          // 500MHz clock
input     CLK_500MHZ_L;          // Active-low version of CLK_500MHZ_H
input     SUMAC_RESET_L;         // Power-on reset
input     SIM_RESET_L;           // Simulation reset
input     DSC_ENB;               // Enable deskew logic
input     AC_WIDTH16;            // 8/16 bit mode of operation (0/1)
input     CLK_IN;                // HiPPI clock input
input     CLK_OUT;               // Ungated DSC clock output to the SSR
input     ALL_PRESENT;           // Ping pulse seen at all channels
input     SCAN_GATE;             // Testability input
input     LSSD_A;                // Testability input
input     LSSD_B;                // Testability input
input     LSSD_C;                // Testability input
input     LSSD_SI;               // Testability input
output    TRAIN_ENB;             // Training micro-packet detected
output    TRAIN_ENB_DLY;         // TRAIN_ENB delayed by 2nS
output    ENB_CLK_OUT;           // Enable the clock output of the DSC
output    NORM_UPKT;             // Non-training micro-packet detected
output    MEAS_CLK_PER_8B;       // Start of a non-training upkt in 8b mode
output    MEAS_CLK_PER_16B;      // Start of a non-training upkt in 16b mode
output    LSSD_SO;               // Testability output
wire      CLK_500MHZ_H;
wire      CLK_500MHZ_L;
wire      SUMAC_RESET_L;
wire      SIM_RESET_L;
wire      DSC_ENB;
wire      AC_WIDTH16;
wire      CLK_IN;
wire      CLK_OUT;
wire      ALL_PRESENT;
wire      SCAN_GATE;
wire      LSSD_A;
wire      LSSD_B;
wire      LSSD_C;
wire      LSSD_SI;
reg       TRAIN_ENB;
reg       TRAIN_ENB_DLY;
reg       ENB_CLK_OUT;
reg       UPDATE_ERROR;
reg       NORM_UPKT;
wire      MEAS_CLK_PER_8B;
wire      MEAS_CLK_PER_16B;
wire      LSSD_SO;
/*
* Module:    dsc_cntl
*
* Description: This module is the control portion of the dynamic skew
*     compensation circuit (the DSC). It is implemented as
*     a standard cell RLM in contrast to the custom designed
*     DSC datapath.
*
* Interfaces: DSC datapath
*
* Major Components:
*     Input synchronization
*     State of operation SM
*     Training micro-packet detection at input
*     Normal micro-packet detection
*     Training micro-packet detection at output
*     ENB_CLK_OUT generation
*
/* Internal nets */
wire   [4:0] rst_sync;
wire   [4:0] enb_sync;
wire   [4:0] ap_sync;
wire   nxt_acpt_trn_upkt;
wire   rcvd_trn_upkt;
wire   rcvd_norm_upkt;
reg    acpt_trn_upkt;
wire   acpt_norm_upkt;
wire   clk_in_sg;
reg    clki_div2;
wire   clki_src;
wire   clki_src_sg;
wire   clki_src_l;
```

-continued

```
wire      clki_src_sg_l;
wire      [5:0] clki_sync_h;
wire      [5:0] clki_sync_l;
wire      nxt_clki_const;
reg       clki_const;
wire      set_trn_enbi;
wire      clr_trn_enbi;
wire      nxt_trn_enbi;
reg       trn_enbi;
wire      nxt_clki_tgl;
reg       clki_tgl;
wire      set_norm_upkt;
wire      clr_norm_upkt;
wire      nxt_norm_upkt;
reg       norm_upkt_r;
reg       [2:0] norm_cnt;
wire      nxt_norm_tmr_done;
reg       norm_tmr_done;
wire      clk_out_sg;
reg       clko_div2;
wire      clko_src;
wire      clko_src_l;
wire      [3:0] clko_sync_h;
wire      [3:0] clko_sync_l;
wire      nxt_clko_const;
reg       clko_const;
wire      set_trn_enbo;
wire      clr_trn_enbo;
wire      nxt_trn_enbo;
reg       [3:0] trn_cnt;
wire      nxt_trn_tmr_done;
reg       trn_tmr_done;
reg       [6:0] ap_dly;
/* Synchronize inputs
*
D_F_LMS0101_A sync_rst_0 (.L2(rst_sync[0]), .D(~SUMAC_RESET_L),
.E(CLK_500MHZ_H));
D_F_LMS0101_A sync_rst_1 (.L2(rst_sync[1]), .D(rst_sync[0] ), .E(CLK_500MHZ_H));
D_F_LMS0101_A sync_rst_2 (.L2(rst_sync[2]), .D(rst_sync[1] ), .E(CLK_500MHZ_H));
D_F_LMS0101_A sync_rst_3 (.L2(rst_sync[3]), .D(rst_sync[2] ), .E(CLK_500MHZ_H));
D_LDM00001_A sync_rst_4 (.L2(rst_sync[4]), .D(rst_sync[3] ), .E(CLK_500MHZ_H));
D_F_LMS0101_A sync_enb_0 (.L2(enb_sync[0]), .D(DSC_ENB   ), .E(CLK_500MHZ_H));
D_F_LMS0101_A sync_enb_1 (.L2(enb_sync[1]), .D(enb_sync[0]), .E(CLK_500MHZ_H));
D_F_LMS0101_A sync_enb_2 (.L2(enb_sync[2]), .D(enb_sync[1]), .E(CLK_500MHZ_H));
D_F_LMS0101_A sync_enb_3 (.L2(enb_sync[3]), .D(enb_sync[2]), .E(CLK_500MHZ_H));
D_LDM0001_A sync_enb_4 (.L2(enb_sync[4]), .D(enb_sync[3]), .E(CLK_500MHZ_H));
D_F_LMS0101_A sync_ap_0 (.L2(ap_sync[0]), .D(ALL_PRESENT),
.E(CLK_500MHZ_H));
D_F_LMS0101_A sync_ap_1 (.L2(ap_sync[1]), .D(ap_sync[0]), .E(CLK_500MHZ_H));
D_F_LMS0101_A sync_ap_2 (.L2(ap_sync[2]), .D(ap_sync[1]), .E(CLK_500MHZ_H));
D_F_LMS0101_A sync_ap_3 (.L2(ap_sync[3]), .D(ap_sync[2]), .E(CLK_500MHZ_H));
D_LDM0001_A sync_ap_4 (.L2(ap_sync[4]), .D(ap_sync[3]), .E(CLK_500MHZ_H));
/* SM for state of operation
*/
// Reset dominant sync SR latch: D = R & (S | Q)
assign nxt_acpt_trn_upkt = (rst_sync[4] | rcvd_trn_upkt)
          & (rcvd_norm_upkt | acpt_trn_upkt);
assign rcvd_trn_upkt    = set_trn_enbo;
assign rcvd_norm_upkt   = set_norm_upkt;
always @(posedge CLK_500MHZ_H)
    acpt_trn_upkt <= #(`GATE_DLY) nxt_acpt_trn_upkt;
assign acpt_norm_upkt = ~acpt_trn_upkt;
/* Detect training micro-packets at input
*
*/
// Divide clock input by 2, select proper source
assign clk_in_sg = CLK_IN | SCAN_GATE;
always @(posedge _clk_in_sg)
    clki_div2 <= ~(~SIM_RESET_L | clki_div2);
assign clki_src = AC_WIDTH16 ? CLK_IN : clki_div2;
// Sample with active-low clock
D_F_LMS0101_A reg_clki_src_1 (.L2(clki_src_1), .D(clki_src), .E(CLK_500MHZ_L));
/* Synchronize
*/
D_F_LMS0101_A sync_clkih_0 (.L2(clki_sync_h[0]), .D(clki_src   ),
*E(CLK_500MHZ_H));
D_F_LMS0101_A sync_clkih_1 (.L2(clki_sync_h[1]), .D(clki_sync_h[0]),
.E(CLK_500MHZ_H));
D_F_LMS0101_A sync_clkih_2 (.L2(clki_sync_h[2]), .D(dki_sync_h[1]),
```

-continued

```
.E(CLK_500MHZ_H));
D_F_LMS0101_A sync_clkih_3 (.L2(clki_sync_h[3]), .D(clki_sync_h[2]),
.E(CLK_500MHZ_H));
D_LDM0001_A sync_clkih_4 (.L2(clki_sync_h[4]), .D(clki_sync_h[3]),
.E(CLK_500MHZ_H));
D_LDM0001_A sync_clkih_5 (.L2(clki_sync_h[5]), .D(clki_sync_h[4]),
.E(CLK_500MHZ_H));
D_F_LMS0101_A sync_clkil_0 (.L2(clki_sync_l[0]), .D(clki_src_l ), .E(CLK_500MHZ_H));
D_F_LMS0101_A sync_clkil_1 (.L2(clki_sync_l[1]), .D(clki_sync_l[0]),
.E(CLK_500MHZ_H));
D_F_LMS0101_A sync_clkil_2 (.L2(clki_sync_l[2]), .D(clki_sync_l[1]),
.E(CLK_500MHZ_H));
D_F_LMS0101_A sync_clkil_3 (.L2(clki_sync_l[3]), .D(clki_sync_l[2]),
.E(CLK_500MHZ_H));
D_LDM0001_A sync_clkil_4 (.L2(clki_sync_l[4]), .D(clki_sync_l[3]),
.E(CLK_500MHZ_H));
D_LDM0001_A sync_clkil_5 (.L2(clki_sync_l[5]), .D(clki_sync_l[4]),
.E(CLK_500MHZ_H));
// Detect training upkts -- 11 or 00 pattern in both synchronizers
assign nxt_clki_const = &{ clki_sync_h[3:2], clki_sync_l[3:2]}
        | &{~clki_sync_h[3:2],~clki_sync_l[3:2]};
always @(posedge CLK_500MHZ_H)
    clki_const <= #(`GATE_DLY) nxt_clki_const;
// Generate TRAIN_ENB -- reset dominant sync SR latch: D = ~R & (S | Q)
assign set_trn_enbi = acpt_trn_upkt & clki_const;
assign clr_trn_enbi = rst_sync[4] TRAIN_ENB;
assign nxt_trn_enbi = ~clr_trn_enbi & (set_trn_enbi | trn_enbi);
always @(posedge CLK_500MHZ_H)
    trn_enbi <= #(`GATE_DLY) nxt_trn_enbi;
/* Detect normal micro-packets */
// Detect normal upkts -- 010 pattern in either synchronizer
assign nxt_clki_tgl = &{~clki_sync_h[5],clki_sync_h[4],~clki_sync_h[3]}
        | &{~clki_sync_l[5],clki_sync_l[4],~clki_sync_l[3]};
always @(posedge CLK_500MHZ_H)
    clki_tgl <= #(`GATE_DLY) nxt_clki_tgl;
// Generate MEAS_CLK_PER_*B -- reset dominant sync SR latch: D = ~R & (S | Q)
assign set_norm_upkt = acpt_norm_upkt & clki_tgl;
assign clr_norm_upkt = rst_sync[4] | norm_tmr_done;
assign nxt_norm_upkt = ~clr_norm_upkt & (set_norm_upkt | NORM_UPKT);
always @(posedge CLK_500MHZ_H)
    NORM_UPKT <= #(`GATE_DLY) nxt_norm_upkt;
assign MEAS_CLK_PER_8B = NORM_UPKT & ~AC_WIDTH16;
assign MEAS_CLK_PER_16B = NORM_UPKT & AC_WIDTH16;
always @(posedge CLK_500MHZ_H) begin
    norm_cnt[0] <= #(`GATE_DLY) ~NORM_UPKT | (norm_cnt[0] ^ norm_cnt[2]);
    norm_cnt[1] <= #(`GATE_DLY) ~NORM_UPKT | norm_cnt[0];
    norm_cnt[2] <= #(`GATE_DLY) ~NORM_UPKT | norm_cnt[1];
end
assign nxt_norm_tmr_done = AC_WIDTH16 ? (norm_cnt == 3'b100)
                        :(norm_cnt == 3'b110);
always @(posedge CLK_500MHZ_H)
    norm_tmr_done <= #(`GATE_DLY) nxt_norm_tmr_done;
/* Detect training micro-packets at output */
// Divide clock output by 2, select proper source
assign clk_out_sg = CLK_OUT | SCAN_GATE;
aways @(posedge clk_out_sg)
    clko_div2 <= ~(~SIM_RESET_L | clko_div2);
assign clko_src = AC_WIDTH16 ? CLK_OUT: clko_div2;
// Sample with active-low clock
D_F_LMS0101_A reg_clko_srcJ (.L2(clko_src_l), .D(clko_src), .E(CLK_500MHZ_L));
// Synchronize
D_F_LMS010_A sync_clkoh_0 (.L2(clko_sync_h[0]), .D(clko_src ),
.E(CLK_500MHZ_H));
D_F_LMS0101_A sync_clkoh_1 (.L2(clko_sync_h[1]), .D(clko_sync_h[0]),
.E(CLK_500MHZ_H));
D_F_LMS0101_A sync_clkoh_2 (.L2(clko_sync_h[2]), .D(clko_sync_h[1]),
.E(CLK_500MHZ_H));
D_F_LMS0101_A sync_clkoh_3 (.L2(clko_sync_h[3]), .D(clko_sync_h[2]),
.E(CLK_500MHZ_H));
D_F_LMS0101_A sync_clkol_0 (.L2(clko_sync_l[0]), .D(clko_src_l ),
.E(CLK_500MHZ_H));
D_F_LMS0101_A sync_clkol_1 (.L2(clko_sync_l[1]), .D(clko_sync_l[0]),
.E(CLK_500MHZ_H));
D_F_LMS0101_A sync_clkol_2 (.L2(clko_sync_l[2]), .D(clko_sync_l[1]),
.E(CLK_500MHZ_H));
D_F_LMS0101_A sync_clkol_3 (.L2(clko_sync_l[3]), .D(clko_sync_l[2]),
.E(CLK_500MHZ_H));
// Detect training upkts -- 11 or 00 pattern in both synchronizers
assign nxt_clko_const = &{ clko_sync_h[3:2], clko_sync_l[3:2]}
```

-continued

```
    | &(~clko_sync_h[3:2],~clko_sync_l[3:2]};
always @(posedge CLK_500MHZ_H)
    clko_const <= #(`GATE_DLY) nxt_clko_const;
// Generate TRAIN_ENB and TRAIN_ENB_DLY
assign set_trn_enbo = trn_enbi & clko_const;
assign clr_trn_enbo = rst_sync[4] | ap_sync[4] | trn_tmr_done;
assign nxt_trn_enbo = ~clr_trn_enbo & (set_trn_enbo | TRAIN_ENB);
always @(posedge CLK_500MHZ_H) begin
    TRAIN_ENB     <= #(`GATE_DLY) nxt_trn_enbo;
    TRAIN_ENB_DLY <= #(`GATE_DLY) TRAIN_ENB;
end
always @(posedge CLK_500MHZ_H) begin
    trn_cnt[0] <= #(`GATE_DLY) ~TRAIN_ENB | (trn_cnt[0] ^ trn_cnt[3]);
    trn_cnt[1] <= #(`GATE_DLY) ~TRAIN_ENB | trn_cnt[0];
    trn_cnt[2] <= #(`GATE_DLY) ~TRAIN_ENB | trn_cnt[1];
    trn_cnt[3] <= #(`GATE_DLY) ~TRAIN_ENB | trn_cnt[2];
end
assign nxt_trn_tmr_done = (trn_cnt == 4'b0001);
always @(posedge CLK_500MHZ_H)
    trn_tmr_done <= #(`GATE_DLY) nxt_trn_tmr_done;
/* Generate ENB_CLK_OUT
*/
always @(posedge CLK_500MHZ_H) begin
    ap_dly[0] <= #(`GATE_DLY) ap_sync[4] | trn_tmr_done;
    ap_dly[1] <= #(`GATE_DLY) ap_dly[0];
    ENB_CLK_OUT <= #(`GATE_DLY) rst_sync[4] | ~enb_sync[4] | (ap_dly[0] &
~ap_dly[1]);
end
endmodule /* dsc_cntl */
```

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A system comprising:
a first clock edge placement circuit including;
a delay line having an input to receive a clock signal from an external clock source and having a plurality of output taps connected to a plurality of inputs of a data selector wherein the data selector provides a delayed clock signal to a logic element external to the system, the delay line adapted to add a delay to the clock signal, the delay respectively sized to ensure a phase of the clock signal is adjusted to control synchronous sampling by the external logic element;
the plurality of output taps included within the delay line, each tap configured to add an incremental delay to the clock signal sufficient to provide a set up time and a bold time and to generate the variable delay;
the data selector coupled to the delay line and coupled to an output, the data selector configured to select one of the plurality of signals from the plurality of output taps;
a second clock edge placement circuit having the same elements as the first clock edge placement circuit wherein the first clock edge placement circuit is associated with a first channel and the second clock edge placement circuit is associated with a second channel; and
a controller coupled to the data selector of the first clock edge placement circuit and coupled to the data selector of the second clock edge placement circuit, the controller operable to periodically detect a training packet, the controller enabling the data selector of the first clock edge placement circuit to select and maintain a particular delay in response to the training packet and the controller enabling the data selector of the second clock edge placement circuit to select and maintain a particular delay in response to the training packet, wherein the delay at the first clock edge placement circuit differs from the delay at the second clock edge placement circuit.

2. The system of claim 1, wherein the delay line is adapted to adjust the delay to ensure the phase of the clock signal at the output remains adjusted to control synchronous sampling by the external logic element of an external destination chip.

3. The system of claim 2, further comprising a measurement latch coupled to the delay line, the measurement latch adapted to measure a period of the clock signal and to determine the size of the delay therefrom.

4. The system of claim 1, wherein between each of two adjacent taps of the plurality of output taps includes at least one delay clement, the at least one delay element sized to add a determinate amount of delay.

5. The system of claim 4, wherein between each of two adjacent taps of the plurality of output taps is a pair of inverters.

6. The system of claim 1, wherein the delay line is built into a first integrated circuit device to implement source synchronous sampling for data signals received by a second integrated circuit device from the first integrated circuit device.

7. The system of claim 1, wherein the incremental delay to the clock signal sufficient to provide a set up time and a hold time is substantially one quarter clock signal.

8. The system of claim 1, wherein the training packet further comprises:
   a training detection portion; and
   a flush sequence to sequence both the clock signal and a data signal.

9. The system of claim 8, wherein the training packet further includes a second training packet.

10. The system of claim 9, wherein the training detection portion detects a first training packet, the second training packet, and a data packet.

11. A system comprising:
   a plurality of clock edge placement circuits, each clock edge placement circuit including:
      a delay line having an input to receive a clock signal from an external clock source and having a plurality of output taps connected to a plurality of inputs of a data selector wherein the data selector provides a delayed clock signal to a logic element external to the system, the delay lie adapted to add a delay to the clock signal, the delay respectively sized to ensure a phase of the clock signal is adjusted to control synchronous sampling by the external logic element;
      the plurality of output taps included within the delay line, each tap configured to add an incremental delay to the clock signal sufficient to provide a set up time and a hold time and to generate the variable delay;
      the data selector coupled to the delay line and coupled to an output, the data selector configured to select one of the plurality of signals from the plurality of output taps; and
   a controller communicatively coupled to at least two of the data selectors of the plurality of clock edge placement circuits, the controller operable to periodically detect a training packet, the controller enabling at least one of the data selectors to select and maintain a particular delay in response to the detected training packet, wherein the training packet further comprises:
      a training detection portion; and
      a flush sequence to quiesce both the clock signal and a data signal, wherein the training detection portion includes a feedback loop adapted to determine if the plurality of clock edge placement circuits are properly trained.

12. The system of claim 11, wherein the delay line is adapted to adjust the delay to ensure the phase of the clock signal at the output remains adjusted to control synchronous sampling by the external logic element of an external destination chip.

13. The system of claim 12, further comprising a measurement latch coupled to the delay line, the measurement latch adapted to measure a period of the clock signal and to determine the size of the delay therefrom.

14. The system of claim 11, wherein between each of two adjacent taps of the plurality of output taps includes at least one delay element, the at least one delay element sized to add a determinate amount of delay.

15. The system of claim 14, wherein between each of two adjacent taps of the plurality of output taps is a pair of inverters.

16. The system of claim 11, wherein the delay line is built into a first integrated circuit device to implement source synchronous sampling for data signals received by a second integrated circuit device from the first integrated circuit device.

17. The system of claim 11, wherein the incremental delay to the clock signal sufficient to provide a set up time and a hold time is substantially one quarter clock signal.

18. The system of claim 11, wherein the training packet further includes a second training packet.

19. The system of claim 18, wherein the training detection portion detects a first training packet, the second training packet, and a data packet.

* * * * *

UNITED STATES PATENT AND TRADEMARK OFFICE
CERTIFICATE OF CORRECTION

PATENT NO. : 6,680,636 B1
DATED : January 20, 2004
INVENTOR(S) : David M. Parry, Paul Everhardt and Hansel Collins It is certified that error appears in the above-identified patent and that said Letters Patent is hereby corrected as shown below:

<u>Column 27,</u>
Line 57, delete "bold" and insert -- hold --, therefor.

<u>Column 28,</u>
Line 35, after "packet" insert -- , --.

<u>Column 29,</u>
Line 4, delete "sequence" (next to "to") and insert -- quiesce --, therefor.
Line 20, delete "lie" and insert -- line --, therefor.

Signed and Sealed this

Fifteenth Day of June, 2004

JON W. DUDAS
*Acting Director of the United States Patent and Trademark Office*